United States Patent
Jain et al.

(10) Patent No.: US 12,557,635 B2
(45) Date of Patent: Feb. 17, 2026

(54) HYBRID POWER RAIL FORMATION IN DIELECTRIC ISOLATION FOR SEMICONDUCTOR DEVICE

(71) Applicant: International Business Machines Corporation, Armonk, NY (US)

(72) Inventors: Nikhil Jain, Apple Valley, MN (US); Prabudhya Roy Chowdhury, Albany, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 17/972,892

(22) Filed: Oct. 25, 2022

(65) Prior Publication Data

US 2024/0136288 A1 Apr. 25, 2024
US 2024/0234317 A9 Jul. 11, 2024

(51) Int. Cl.

| | | |
|---|---|---|
| *H01L 23/528* | (2006.01) | |
| *H01L 21/768* | (2006.01) | |
| *H01L 23/48* | (2006.01) | |
| *H10D 86/01* | (2025.01) | |
| *H10D 86/40* | (2025.01) | |

(Continued)

(52) U.S. Cl.
CPC .... *H01L 23/5286* (2013.01); *H01L 21/76898* (2013.01); *H01L 23/481* (2013.01); *H10D 86/0214* (2025.01); *H10D 86/441* (2025.01); *H10D 86/60* (2025.01); *H01L 21/76224* (2013.01)

(58) Field of Classification Search
CPC .......... H01L 23/5286; H01L 21/76898; H01L 23/481; H01L 21/76224; H01L 21/76895; H01L 21/76897; H01L 23/485; H01L 23/535; H10D 86/0214; H10D 86/441; H10D 86/60; H10D 30/6735; H10D 30/6757

See application file for complete search history.

(56) References Cited

U.S. PATENT DOCUMENTS 9,570,395 B1 * 2/2017 Sengupta .......... H01L 21/76895
10,586,765 B2 3/2020 Smith et al.

(Continued)

FOREIGN PATENT DOCUMENTS

EP 3324436 A1 5/2018

OTHER PUBLICATIONS

Beyne, E. (2016). The 3-D Interconnect Technology Landscape. IEEE Design & Test, 33(3), 8-20.

(Continued)

*Primary Examiner* — Patricia D Valenzuela
(74) *Attorney, Agent, or Firm* — L. Jeffrey Kelly

(57) ABSTRACT

A semiconductor device includes: a channel having layers of silicon separated from each other; a metal gate in contact with the layers of silicon; source/drain regions adjacent to the metal gate; a frontside power rail extending through the layers of silicon; a dielectric separating the frontside power rail from the metal gate; a via-connect buried power rail extending through the dielectric and coupling the frontside power rail to the source/drain regions; and a backside power rail coupled to the frontside power rail. The layers of silicon are wrapped on three sides by the metal gate.

19 Claims, 50 Drawing Sheets

(51) Int. Cl.
    *H10D 86/60*     (2025.01)
    *H01L 21/762*     (2006.01)

(56) References Cited

U.S. PATENT DOCUMENTS

| | | |
|---|---|---|
| 10,636,739 B2 | 4/2020 | Beyne et al. |
| 10,700,207 B2 | 6/2020 | Chen et al. |
| 10,734,224 B2 | 8/2020 | Smith et al. |
| 2019/0057867 A1* | 2/2019 | Smith ............... H01L 21/02603 |
| 2020/0075574 A1 | 3/2020 | Smith et al. |
| 2020/0105671 A1 | 4/2020 | Lai et al. |
| 2020/0294998 A1 | 9/2020 | Lilak et al. |
| 2021/0202385 A1 | 7/2021 | Huang et al. |
| 2021/0343646 A1 | 11/2021 | Chen et al. |
| 2021/0376076 A1 | 12/2021 | Su et al. |
| 2021/0408274 A1 | 12/2021 | Yu et al. |
| 2022/0139914 A1 | 5/2022 | Cheng et al. |

OTHER PUBLICATIONS

Hossen, M. O., Chava, B., Van der Plas, G., Beyne, E., & Bakir, M. S. (2019). Power Delivery Network (PDN) Modeling for Backside-PDN Configurations With Buried Power Rails and μ TSVs. IEEE Transactions on Electron Devices, 67(1), 11-17.

* cited by examiner

HYBRID POWER RAIL FORMATION IN DIELECTRIC ISOLATION FOR SEMICONDUCTOR DEVICE

BACKGROUND

The exemplary embodiments described herein relate generally to semiconductor device fabrication methods and resulting structures and, more specifically, to fabrication methods and resulting semiconductor device structures having hybrid power rail formations.

In semiconductor processing, the manufacture of logic chips can be subdivided into three separate blocks: the front-end-of-line (FEOL), the middle-of-line (MOL) and the back-end-of-line (BEOL). The FEOL covers the processing of the active parts of the chips, i.e., the transistors that reside on the bottom of the chip. Transistors serve as electrical switches, each using three electrodes for operation: a gate, a source, and a drain. Electrical current in the conduction channel between source and drain can be controllably switched on and off by the gate voltage. The BEOL, the final stage of processing, refers to metal layer interconnects that reside in the top part of the chip. The FEOL and the BEOL are tied together by the MOL. The MOL is typically made up of metal structures that serve as contacts to the transistor's source, drain, and gate. These structures connect to the local interconnect layers of the BEOL.

The architectures that make up the FEOL may include gate-all-around (GAA) nanosheet, forksheet, and complementary field effect transistor (CFET) devices. The architectures of these devices impact the local interconnect layers, calling for different BEOL materials (such as ruthenium (Ru), molybdenum (Mo), and metal alloys) and various integration schemes (such as hybrid metallization, semi-damascene, and hybrid-height with zero via structures). Buried power rails (BPRs) are part of the power delivery network and may be used to improve the connectivity of the MOL as well as help to reduce the area at standard cell level by allowing a reduction of the number of metal tracks at the level of local interconnects. Such BPRs may be buried in the FEOL of a chip to help free up routing resources for the interconnects. However, in semiconductor memory devices that use full-VDD bit line pre-charge schemes, via-connect BPR (VBPR) connections may be too weak as high resistance paths.

BRIEF SUMMARY

In one exemplary aspect, a semiconductor device comprises: a channel comprising layers of silicon separated from each other; a metal gate in contact with the layers of silicon; source/drain regions adjacent to the metal gate; a frontside power rail extending through the layers of silicon; a dielectric separating the frontside power rail from the metal gate; a via-connect buried power rail extending through the dielectric and coupling the frontside power rail to the source/drain regions; and a backside power rail coupled to the frontside power rail. The layers of silicon are wrapped on three sides by the metal gate.

In another exemplary aspect, a method comprises: providing a substrate; forming a dielectric fill on a top surface of the substrate to form a first channel region and a second channel region on the top surface of the substrate; forming a front-end-of-line device in each of the first channel region and the second channel region, each front-end-of-line device having a gate, source/drain regions, a second dielectric layer in the device comprising a second dielectric material, and a first dielectric layer comprising a first dielectric material surrounding the second dielectric layer; forming a shallow gate cut between the front-end-of-line device in the first channel region and the front-end-of-line device in the second channel region and filling the shallow gate cut with a third dielectric material; forming a first deep gate cut in the front-end-of-line device in the first channel region; forming a second deep gate cut in the front-end-of-line device in the second channel region; forming a first frontside power rail in the first deep gate cut; forming a second frontside power rail in the second deep gate cut; forming two or more frontside contacts to connect each of the first frontside power rail and the second frontside power rail to respective source/drain regions; forming a first backside power rail to the first frontside power rail; and forming a second backside power rail to the second frontside power rail. The front-end-of-line device in each of the first channel region and the second channel region is wrapped on three sides by the respective gate.

In another exemplary aspect, a method of forming a hybrid power rail formation in dielectric isolation for a semiconductor device comprises: providing a silicon substrate; forming a device on the substrate, the device having a channel, a replacement high-k metal gate around a portion of the channel, and source/drain regions adjacent to the replacement high-k metal gate; depositing an interlayer dielectric on the device; forming a deep gate cut in the device; forming a frontside power rail in the deep gate cut, the frontside power rail being isolated from the channel, the first replacement high-k metal gate, and the source/drain regions adjacent to the replacement high-k metal gate; forming a via-connect buried power rail to connect the source/drain regions adjacent to the replacement high-k metal gate to the frontside power rail; depositing a middle-of-the-line interlayer dielectric over the via-connect buried power rail; forming one or more contacts to the via-connect buried power rail; forming a back-end-of-line layer to the one or more contacts; and forming a backside power rail to the frontside power rail from a surface opposite to the back-end-of-line layer. Forming the device comprises configuring the device such that the channel is wrapped on three sides by the gate.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1:
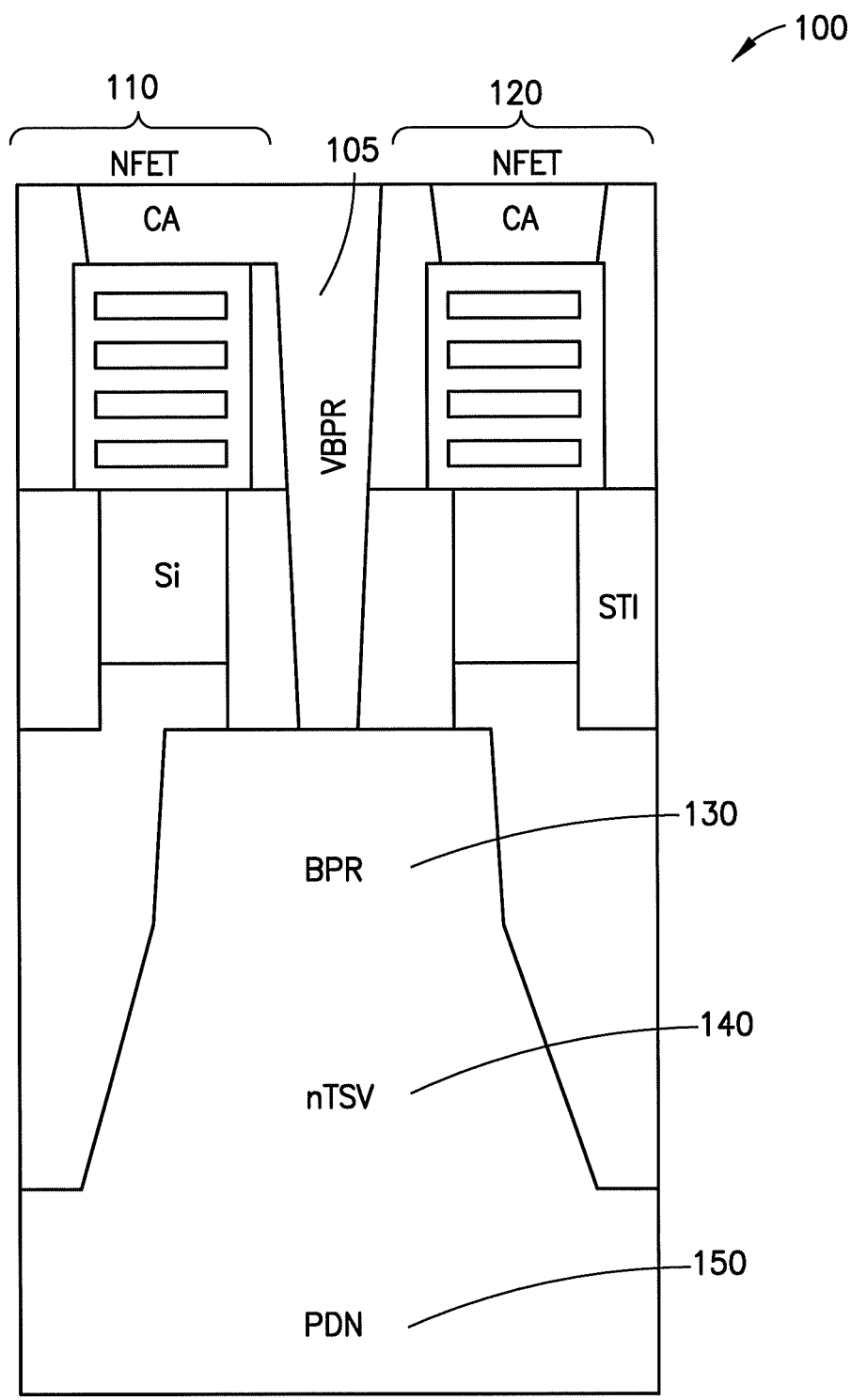
FIG. 1 is a schematic representation of a side view of a device having a frontside via-connect buried power rail.

The exemplary embodiments described herein are directed to a forksheet device having a frontside power rail (FSPR) over a backside power rail (BSPR). In FIG. 1, a device 100 includes a first NFET 110 and a second NFET 120, with a frontside via-connect buried power rail 105 (VBPR 105) positioned between the first NFET 110 and the second NFET 120. The VBPR 105 is in communication with a buried power rail 130 (BPR 130), which is in communication with a nanoscale through-silicon via 140 (nTSV 140). A power distribution network 150 (PDN 150) is disposed on a backside of the device 100. The VBPR 105 is narrow and long relative to the structures of the NFETs, which may provide a resistance bottleneck in the device 100.

Figure 2A:
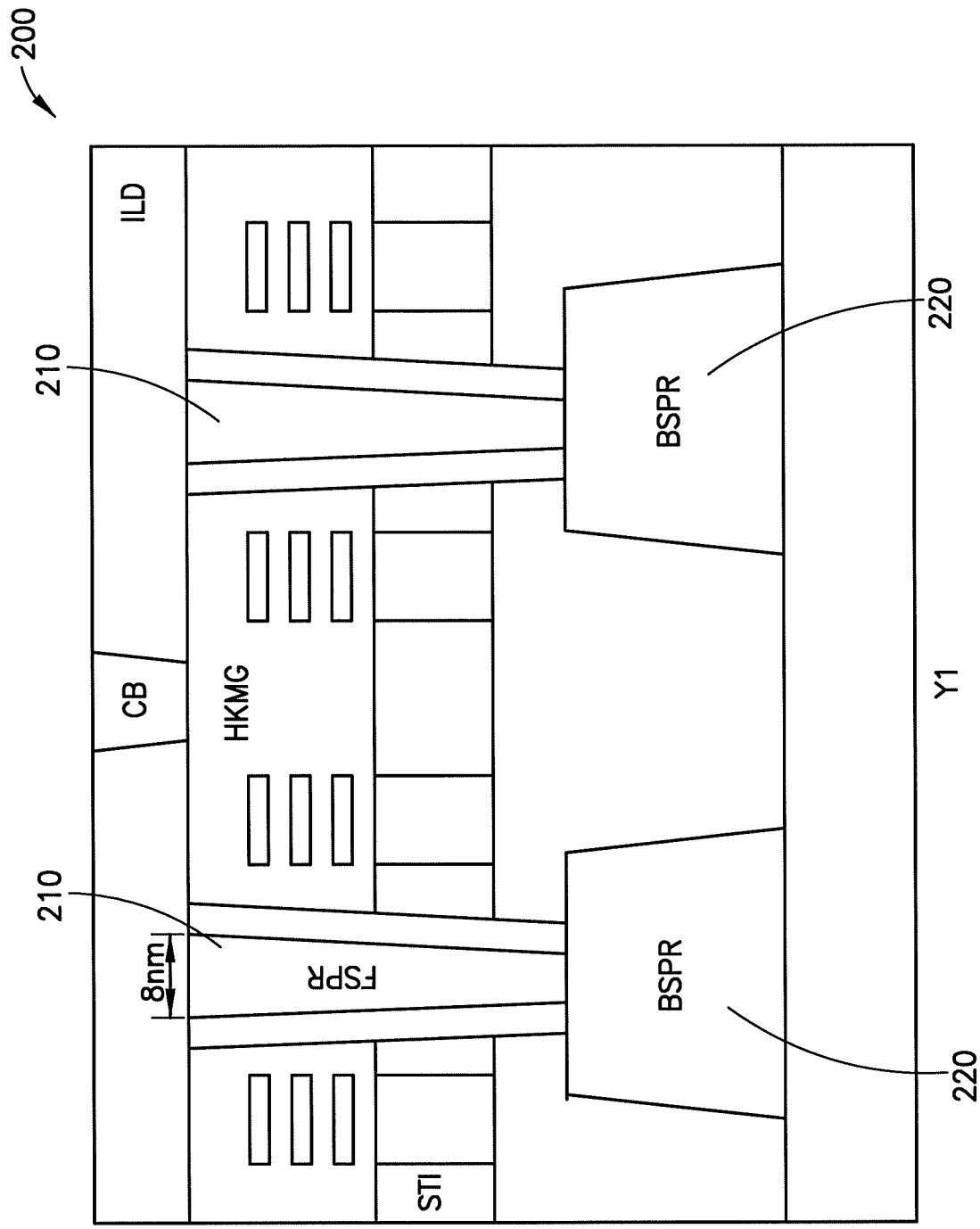
FIGS. 2A and 2B are schematic representations of side views of one exemplary embodiment of a device having a frontside power rail over a backside power rail.
Figure 2B:
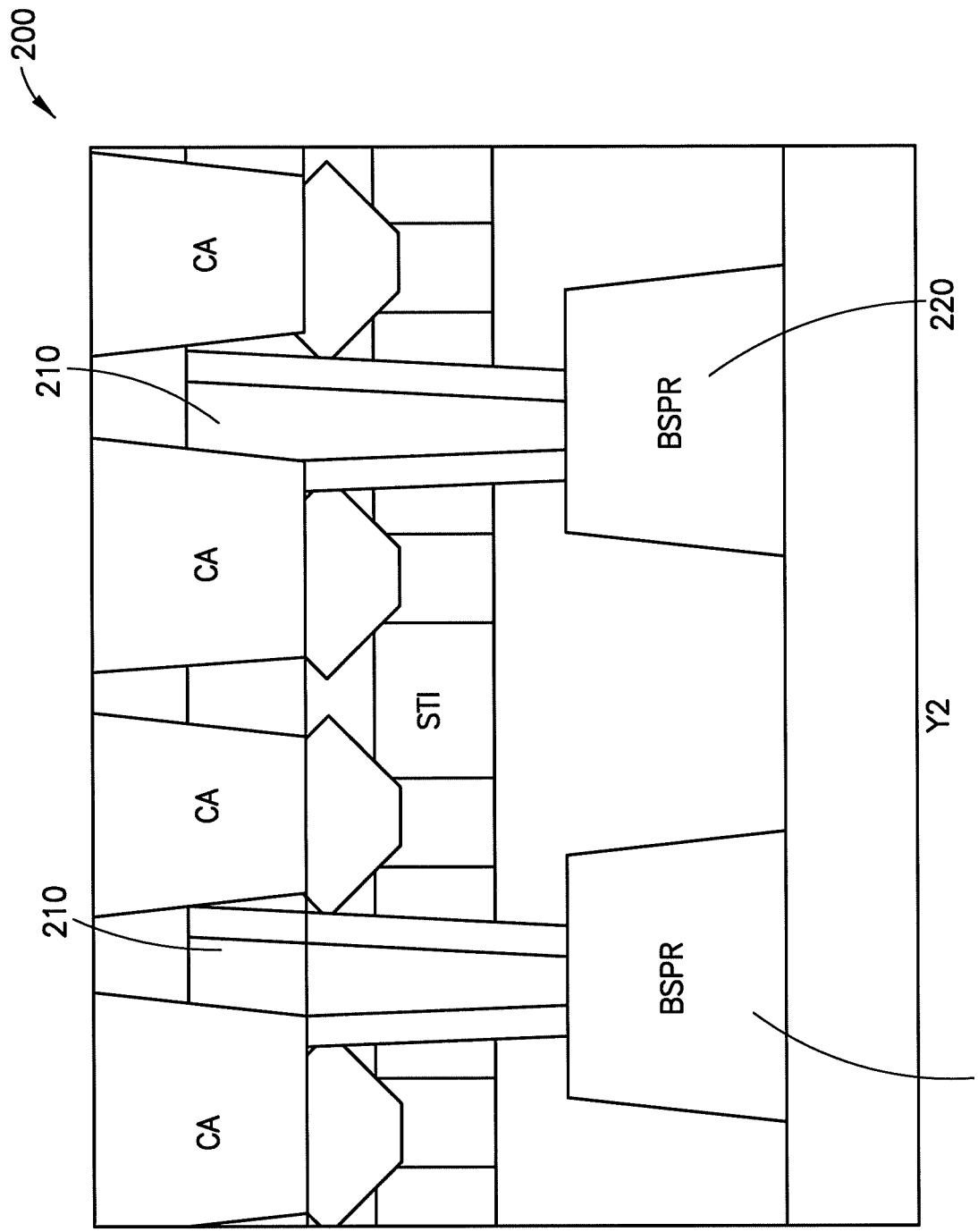

Referring now to FIGS. 2A and 2B, one potential solution to address the resistance bottleneck in the device of FIG. 1 may be to incorporate the FSPR 210 over a BSPR 220, thus obviating the need to use a VBPR. However, as scaling continues, the N2N or P2P space on a wafer 200 may be only about 40 nanometers (nm) wide, and the cross dimension of an FSPR 210 on the wafer 200 may be only about 8 nm (space taken up by gate extensions and insulators on either side of the FSPR also is accounted for).

Figure 3A:
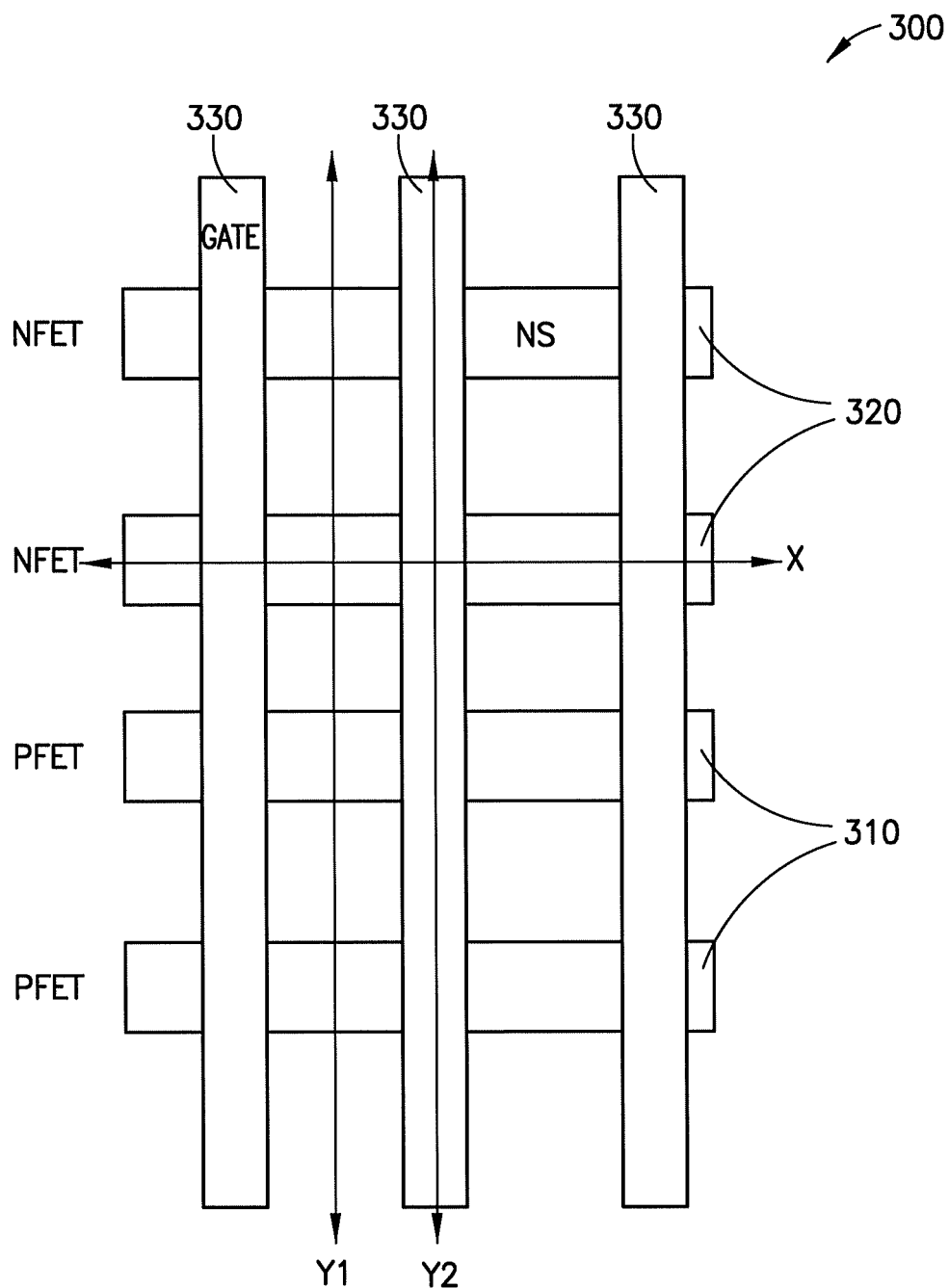
FIG. 3A is a schematic top view of one exemplary embodiment of an arrangement of PFETs, NFETs, and gates during a fabrication of a semiconductor device.

Referring now to FIGS. 3A through 19C, exemplary methods of the fabrication of a device having the FSPR 210 over the BSPR 220 are shown. In FIG. 3A, one exemplary arrangement of PFETs, NFETs, and gates is shown generally at 300 and is hereinafter referred to as "arrangement 300." As shown in arrangement 300, a row of PFETs 310 is arranged next to a row of NFETs 320. A plurality of gates 330 extend perpendicularly to the PFETs 310 and the NFETs 320. A view X is shown across one row of the NFETs 320, a view Y1 is shown across the rows of PFETs 310 and NFETs 320, and a view Y2 is shown across one of the gates 330.

Figure 3B:
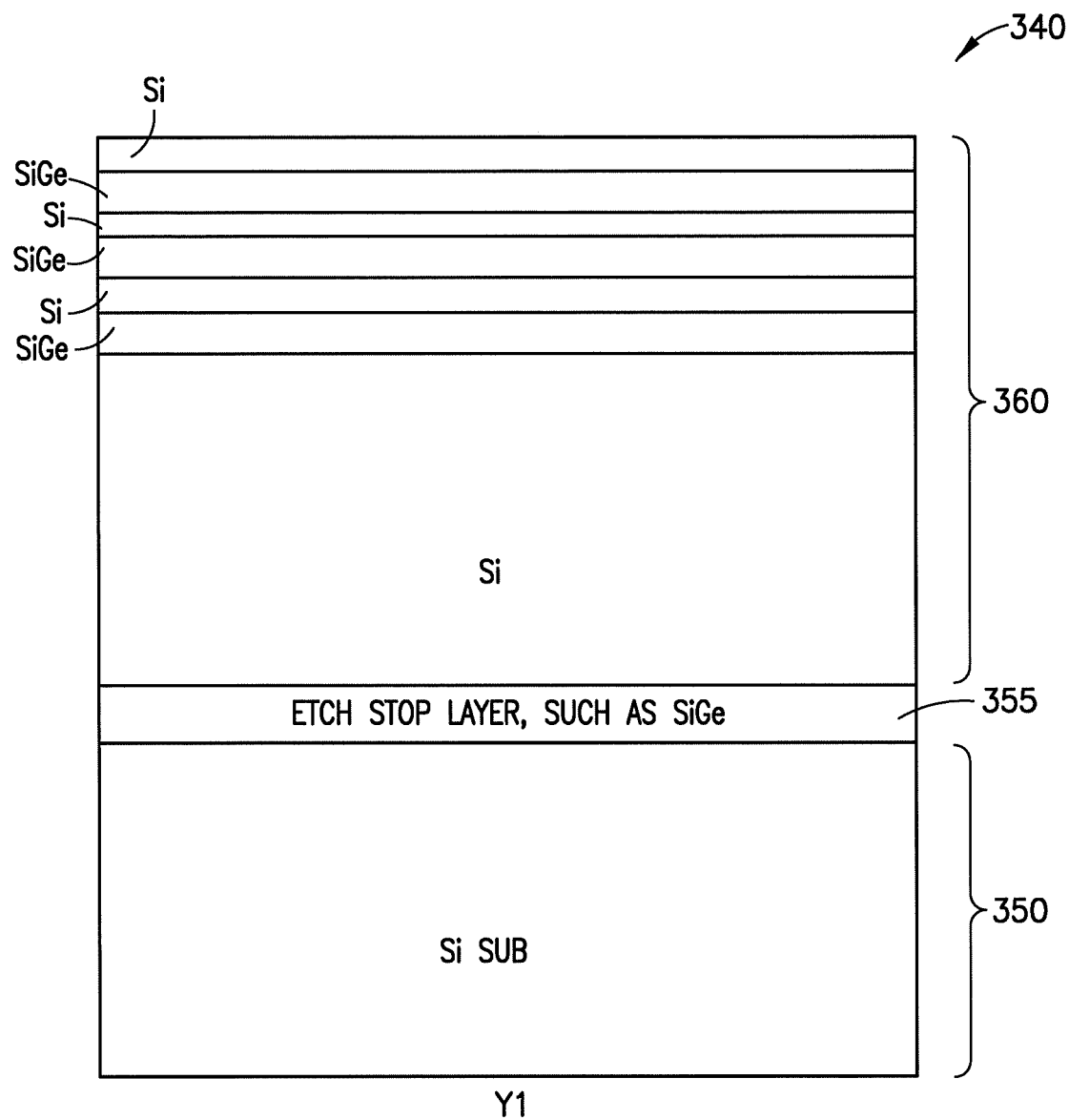
FIG. 3B is a schematic side view of a substrate structure on which a device may be fabricated.

In FIG. 3B, an initial substrate structure 340 is provided. The view Y1 (from FIG. 3A) depicts a silicon substrate 350 on which an etch stop layer 355 is disposed, on which a bulk layer 360 of silicon is disposed. The bulk layer 360 has disposed thereon alternating layers of SiGe and silicon.

Figure 4:
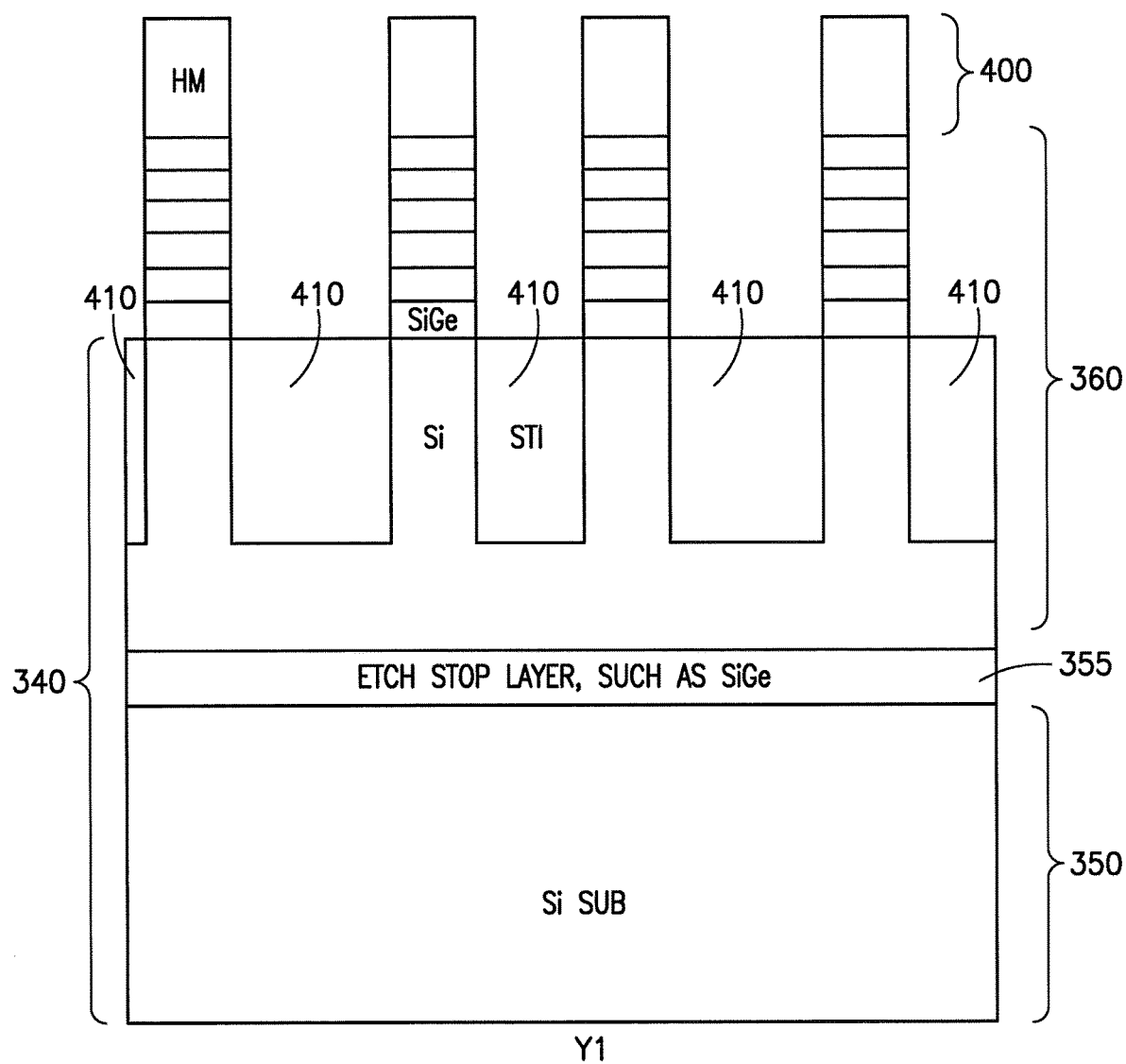
FIG. 4 is a schematic side view of the substrate structure of FIG. 3B after patterning and shallow trench isolation formation.

As shown in FIG. 4, a hardmask layer 400 is disposed on an upper surface of the top layer of silicon of the bulk layer 360. The hardmask layer 400 is patterned and etching is carried out to form shallow trenches through the alternating layers of SiGe and silicon and into the underlying bulk silicon of the bulk layer 360. A dielectric material is deposited into the trenches to form shallow trench isolations 410 (STI 410). The dielectric material of the STI 410 may be deposited by physical vapor deposition (PVD), chemical vapor deposition (CVD), plasma-enhanced CVD (PE-CVD), atomic layer deposition (ALD), or the like.

Figure 5:
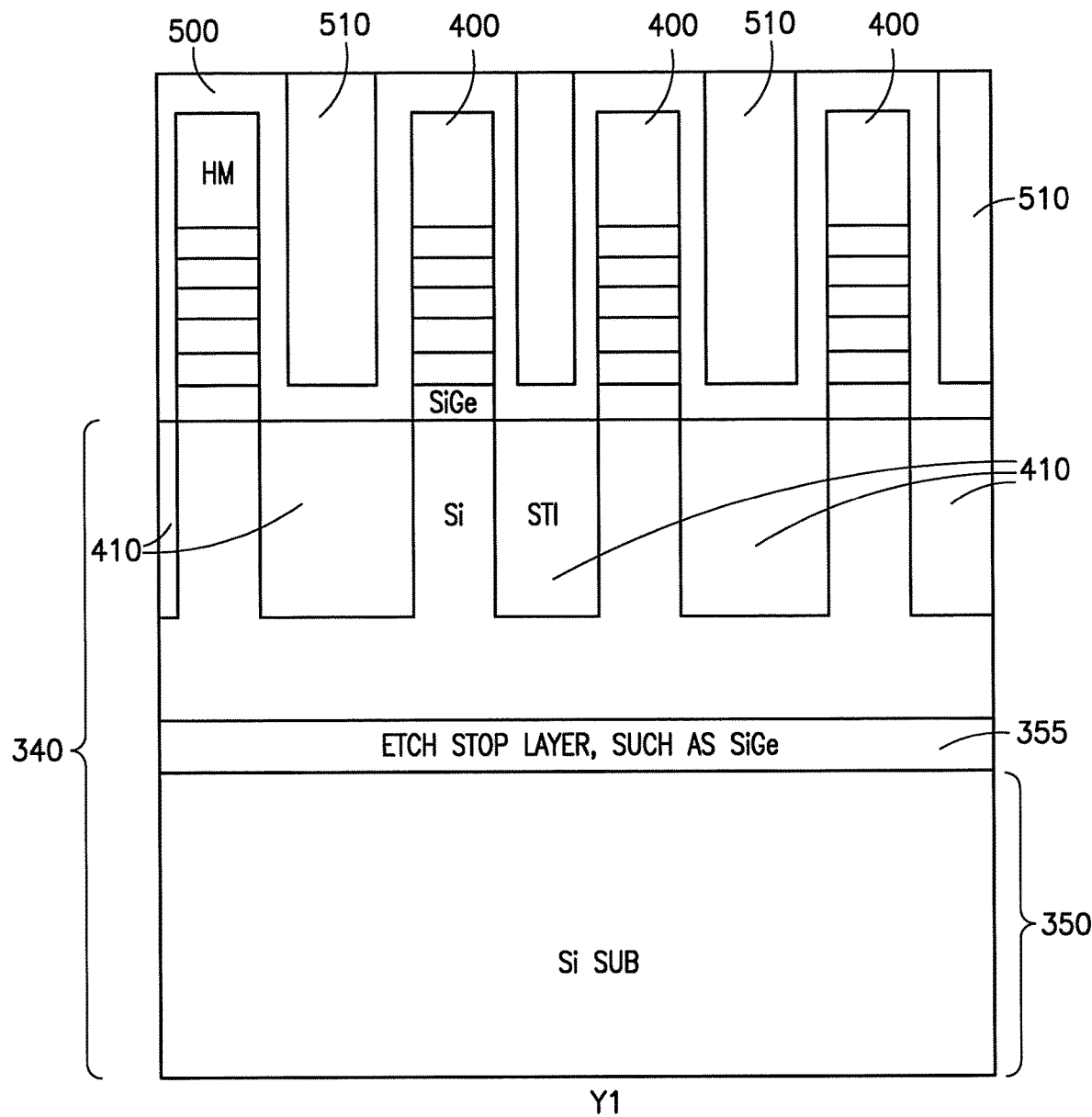
FIG. 5 is a schematic side view of the structure of FIG. 4 after deposition of dielectrics.

As shown in FIG. 5, a first dielectric 500 is deposited onto the STI 410 and the stacks of alternating layers of SiGe and silicon covered by the hardmask layer 400. A second dielectric 510 is deposited into the spaces between the stacks. Each stack of alternating layers of SiGe and silicon separated by the first dielectric 500 forms a channel. A chemical mechanical polish (CMP) is carried out to planarize and remove any overfill of the second dielectric 510.

Figure 6:
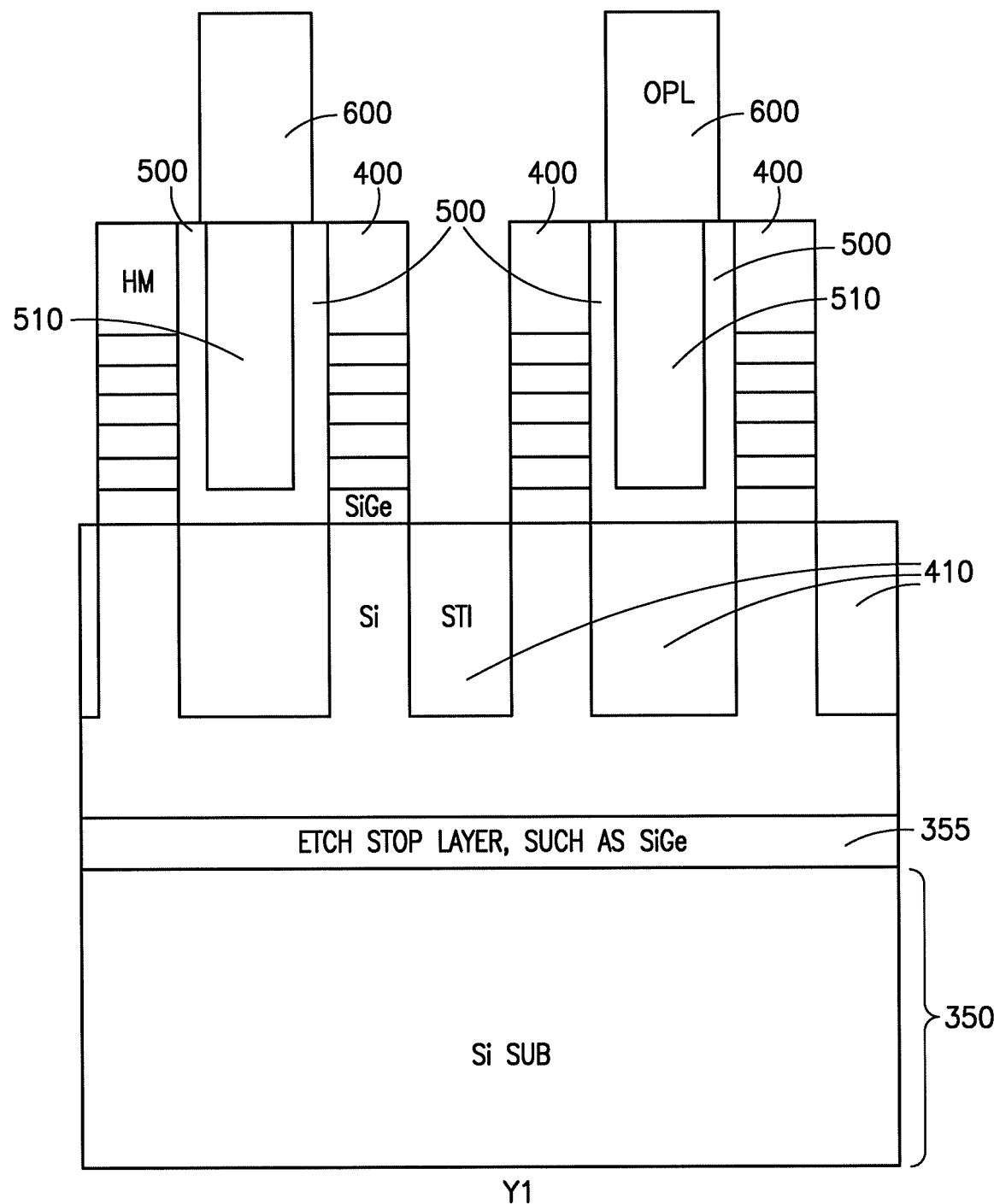
FIG. 6 is a schematic side view of the structure of FIG. 5 with dielectrics removed and an organic planarization layer deposited thereon.

As shown in FIG. 6, a self-aligned organic planarization layer 600 (OPL 600) is deposited onto the planarized surface. The OPL 600 is then patterned and etched (for example, using reactive ion etching (RIE)) to remove the first dielectric 500 and the second dielectric 510 between adjacent pairs of stacks that subsequently form the PFETs 310 and the NFETs 320.

Figure 7:
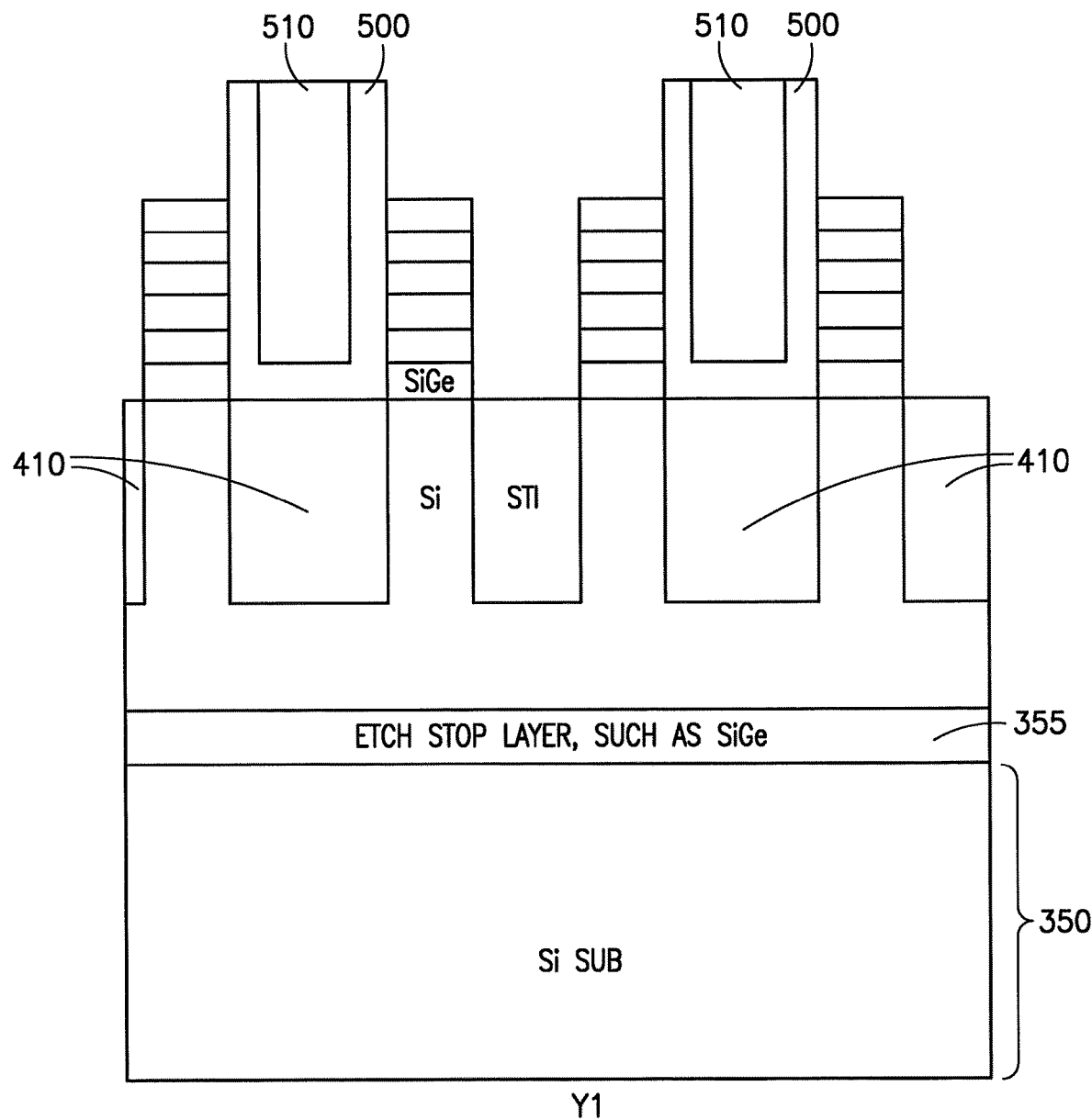
FIG. 7 is a schematic side view of the structure of FIG. 6 with the organic planarization layer removed.

As shown in FIG. 7, the OPL 600 and the hardmask layer 400 are removed using an etching process (such as RIE).

Figure 8A:
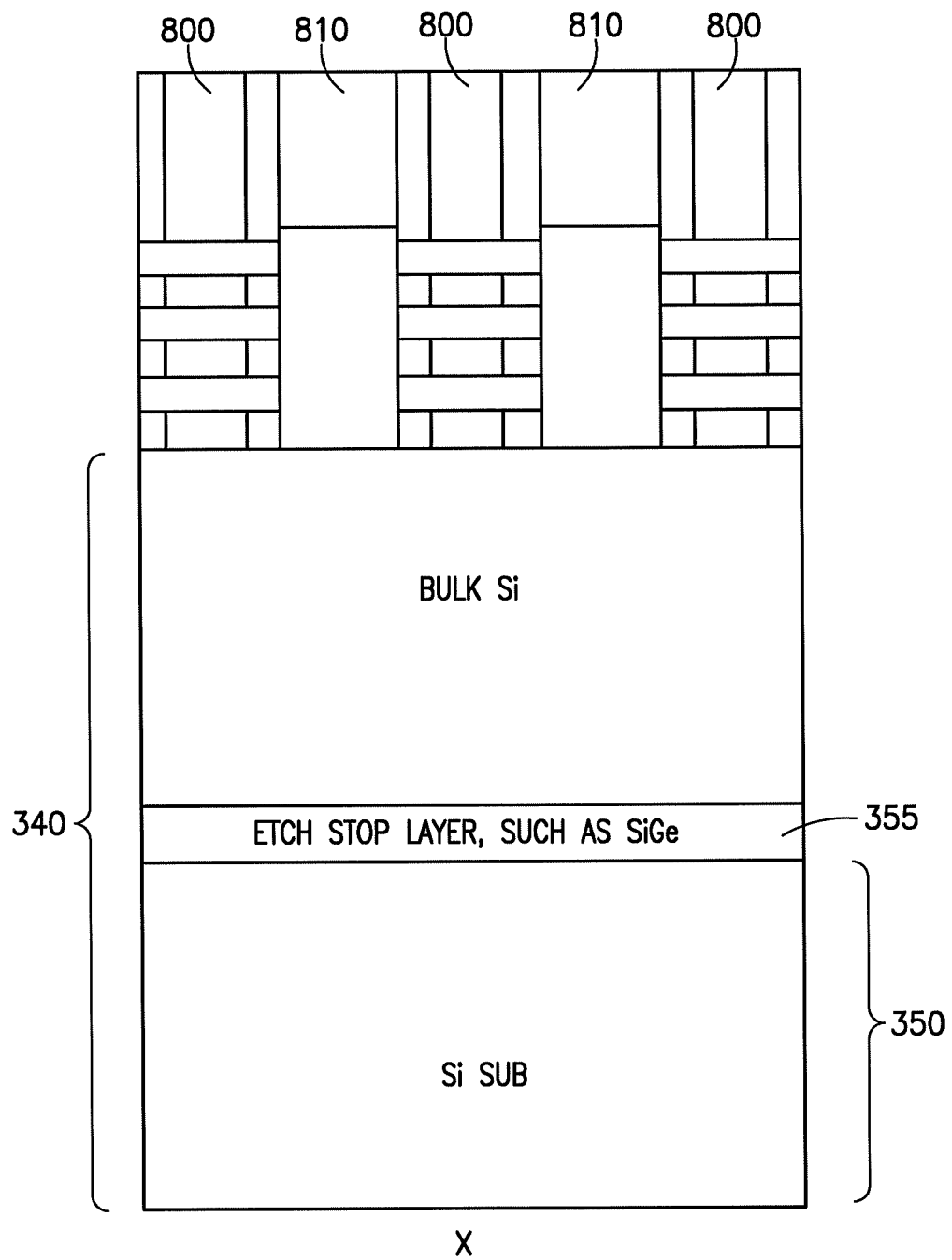
FIG. 8A is a schematic front view of the structure of FIG. 7 during forming of a front-end-of-line device.
Figure 8B:
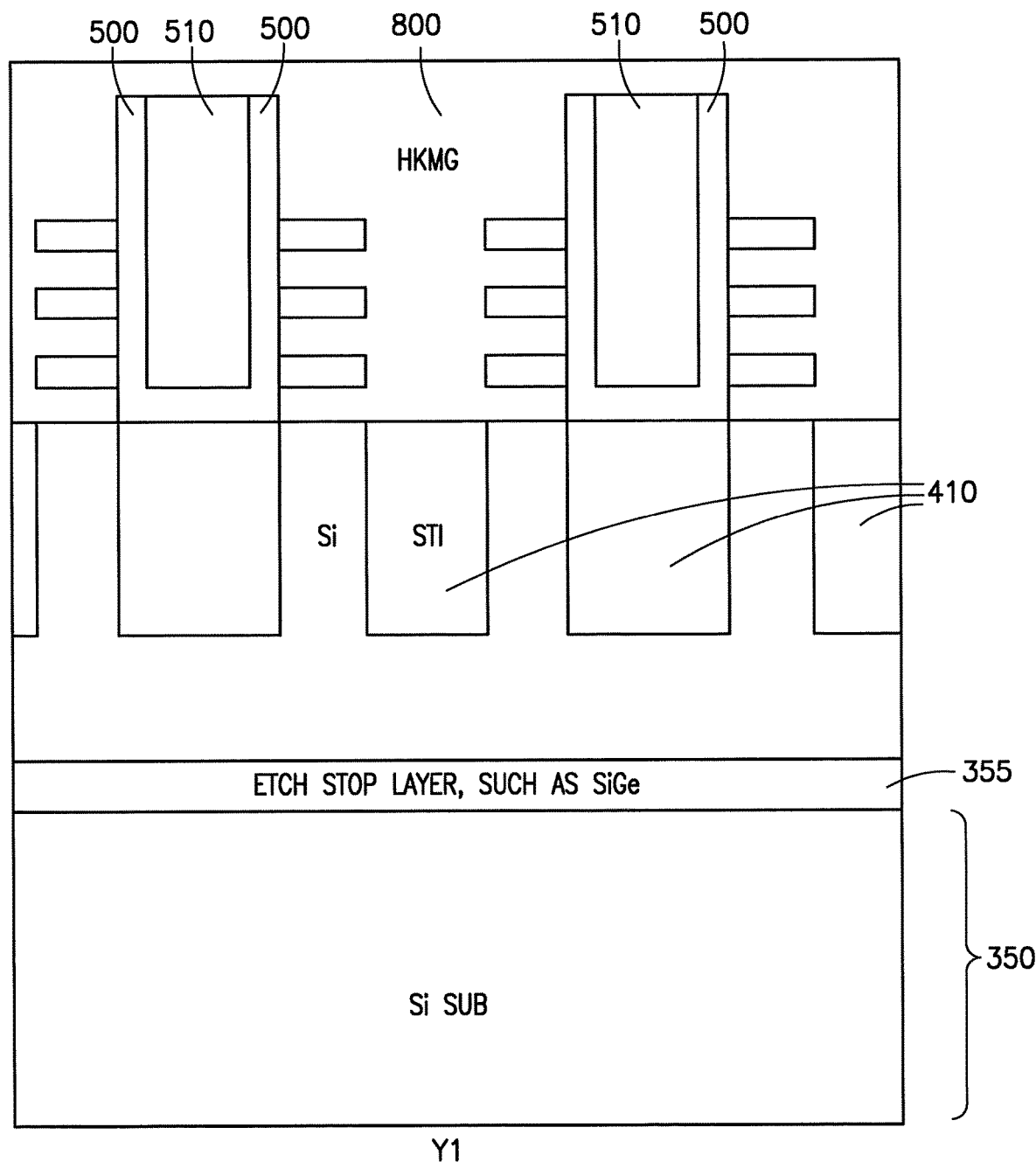
FIGS. 8B and 8C are schematic side views of the structure of FIG. 8A at different cross sections.
Figure 8C:
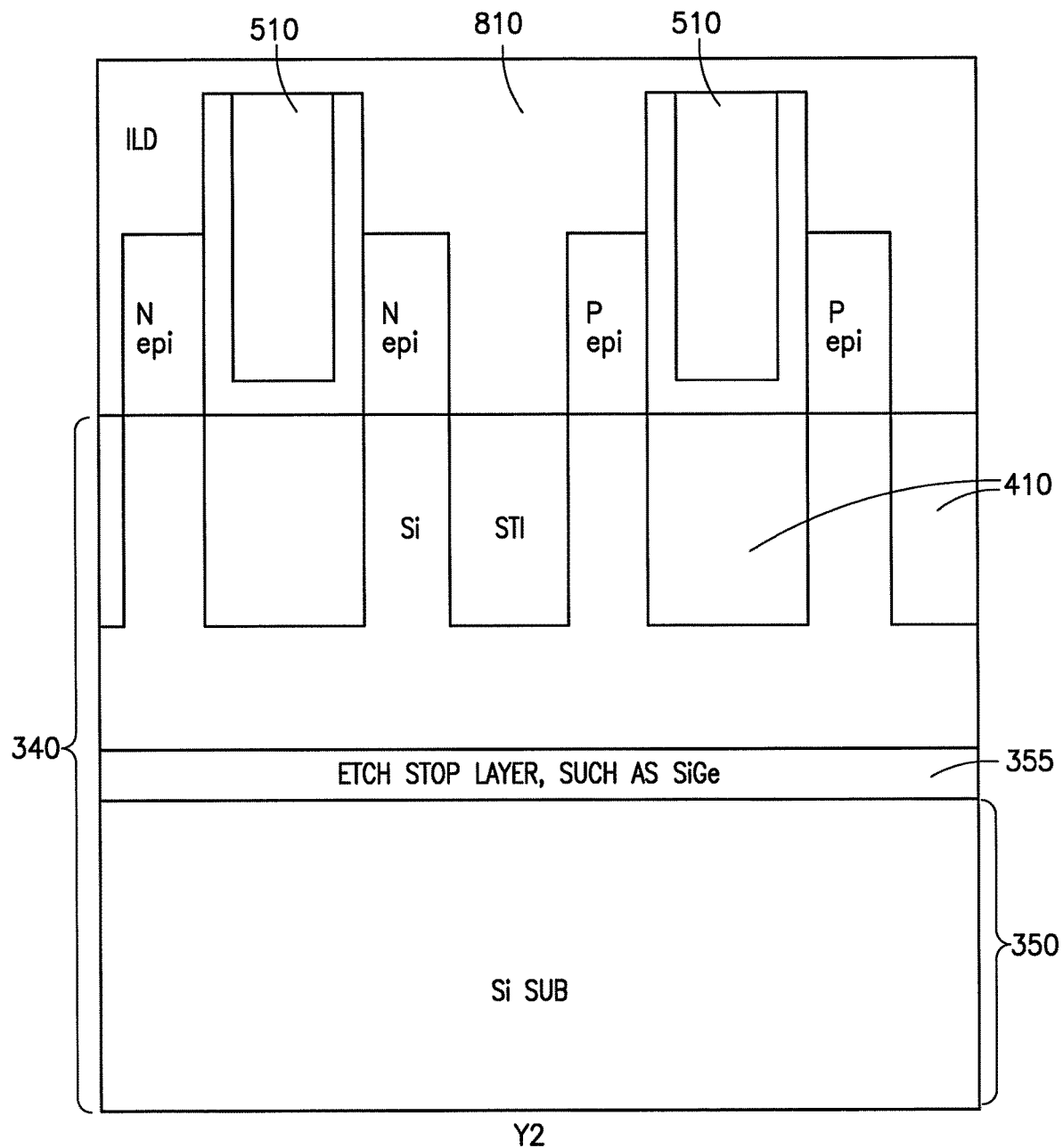

As shown in FIGS. 8A, 8B, and 8C, front-end-of-line (FEOL) processing is carried out. In doing so, the SiGe layers are removed from the stacks by isotropic dry or wet etch. Spaces left by the removal of the SiGe layers, as well as the spaces between the adjacent pairs of stacks that subsequently form the PFETs 310 and the NFETs 320, are filled with a high-k metal to form high-k replacement metal gates 800 (HKMG 800), as shown in FIGS. 8A and 8B to form the forksheet structure. The HKMG 800 is formed by any suitable deposition technique, such as PVD, CVD, PE-CVD, ALD, or the like. Patterning is carried out, and an interlayer dielectric 810 (ILD 810) is then deposited around the HKMG 800, as shown in FIGS. 8A and 8C.

Figure 9A:
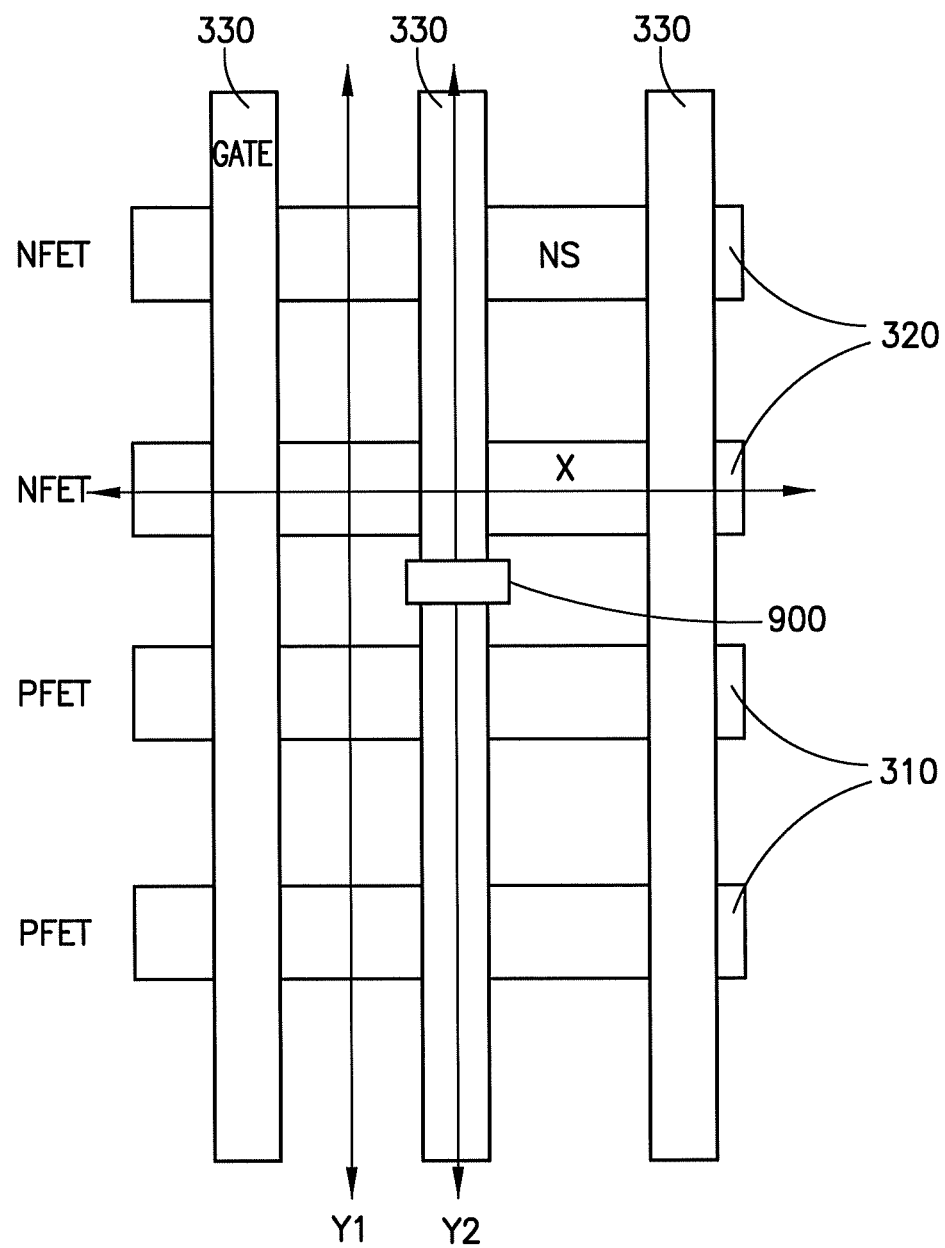
FIG. 9A is a schematic top view of the structure with a shallow gate cut.
Figure 9B:
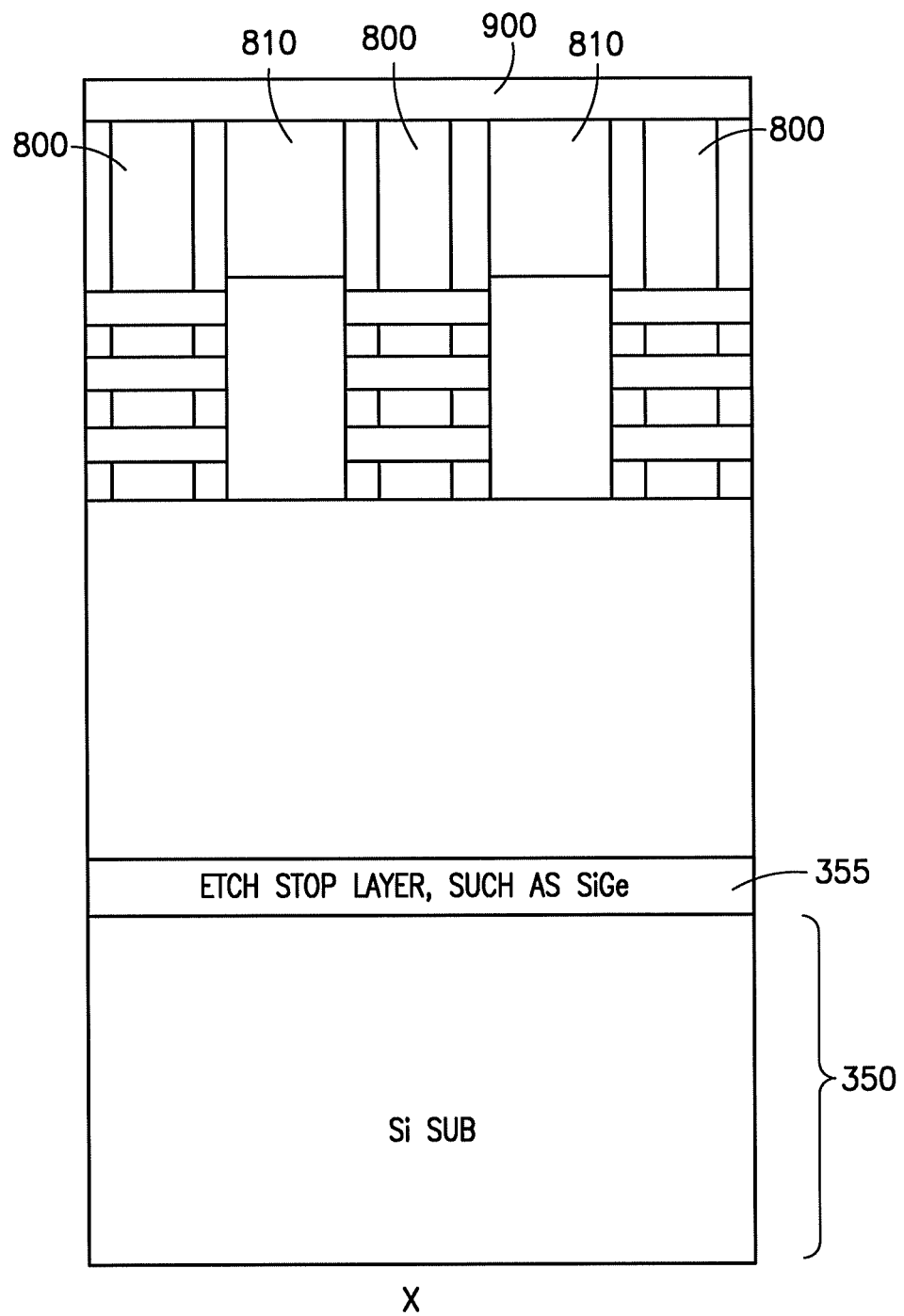
FIG. 9B is a schematic front view of the structure of FIG. 9A.
Figure 9C:
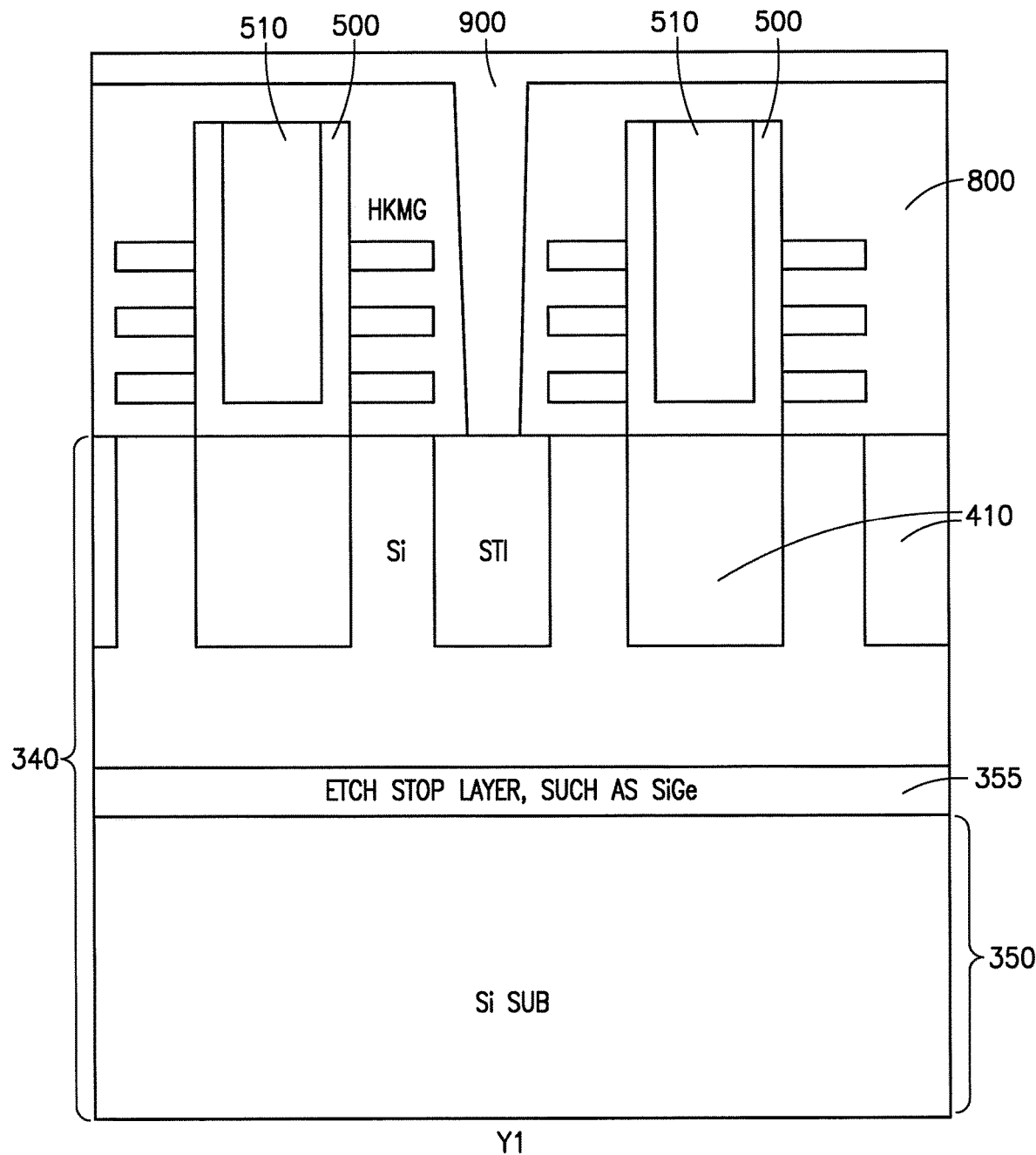
FIGS. 9C and 9D are schematic side views of the structure of FIGS. 9A and 9B.
Figure 9D:
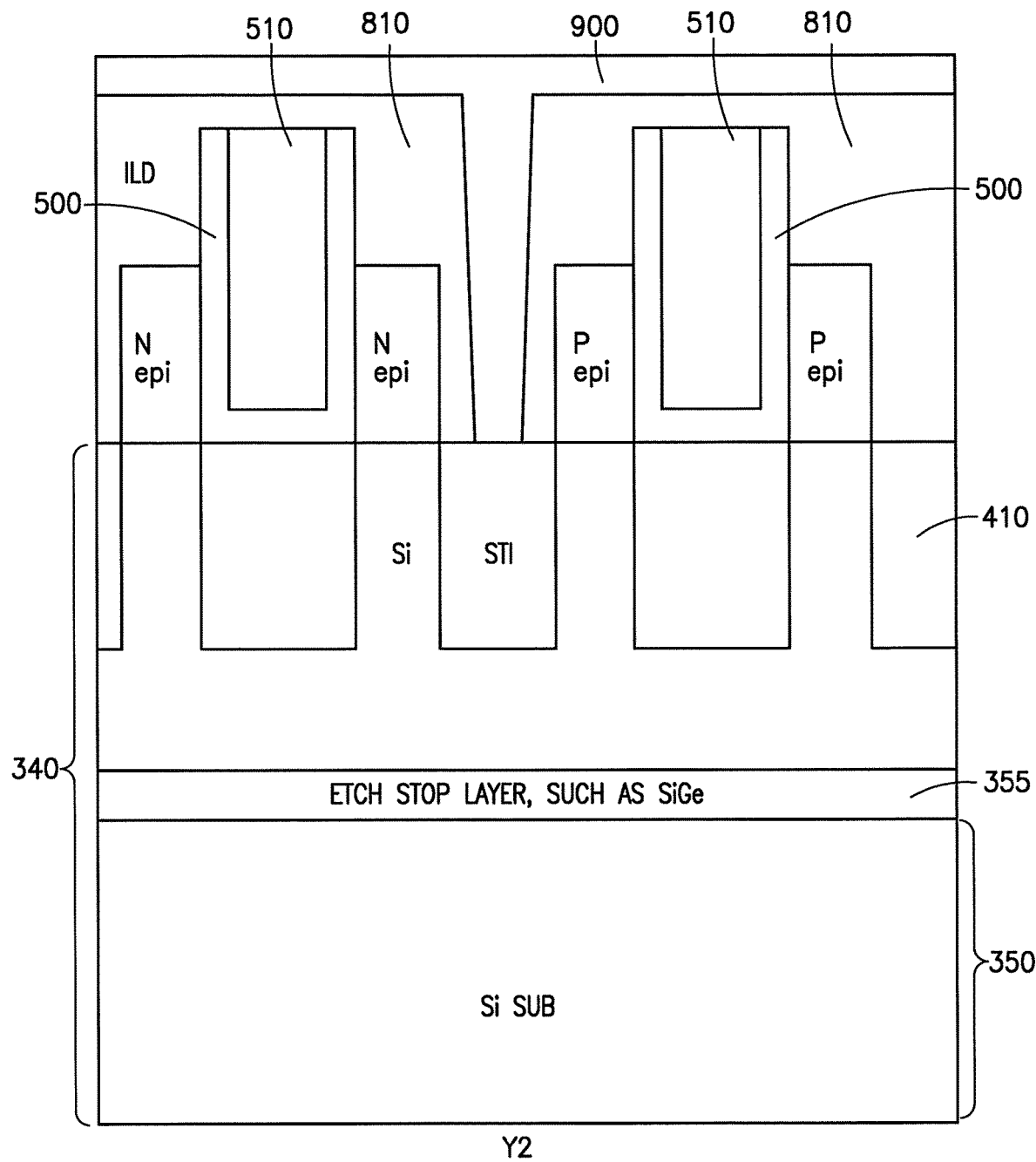

Referring now to FIGS. 9A, 9B, 9C, and 9D, a shallow gate cut is formed in the HKMG 800 (FIGS. 9C and 9D (views Y1 and Y2)). As shown in FIG. 9A, the shallow gate cut is formed in the gate 330 across the Y2 view. The shallow gate cut is formed by etching. The space left by the shallow gate cut is then filled with a shallow gate cut dielectric material 900 (for example, by PVD, CVD, PECVD, ALD, or the like) that extends over an upper surface of the ILD 810, as shown in FIGS. 9B and 9D.

Figure 10A:
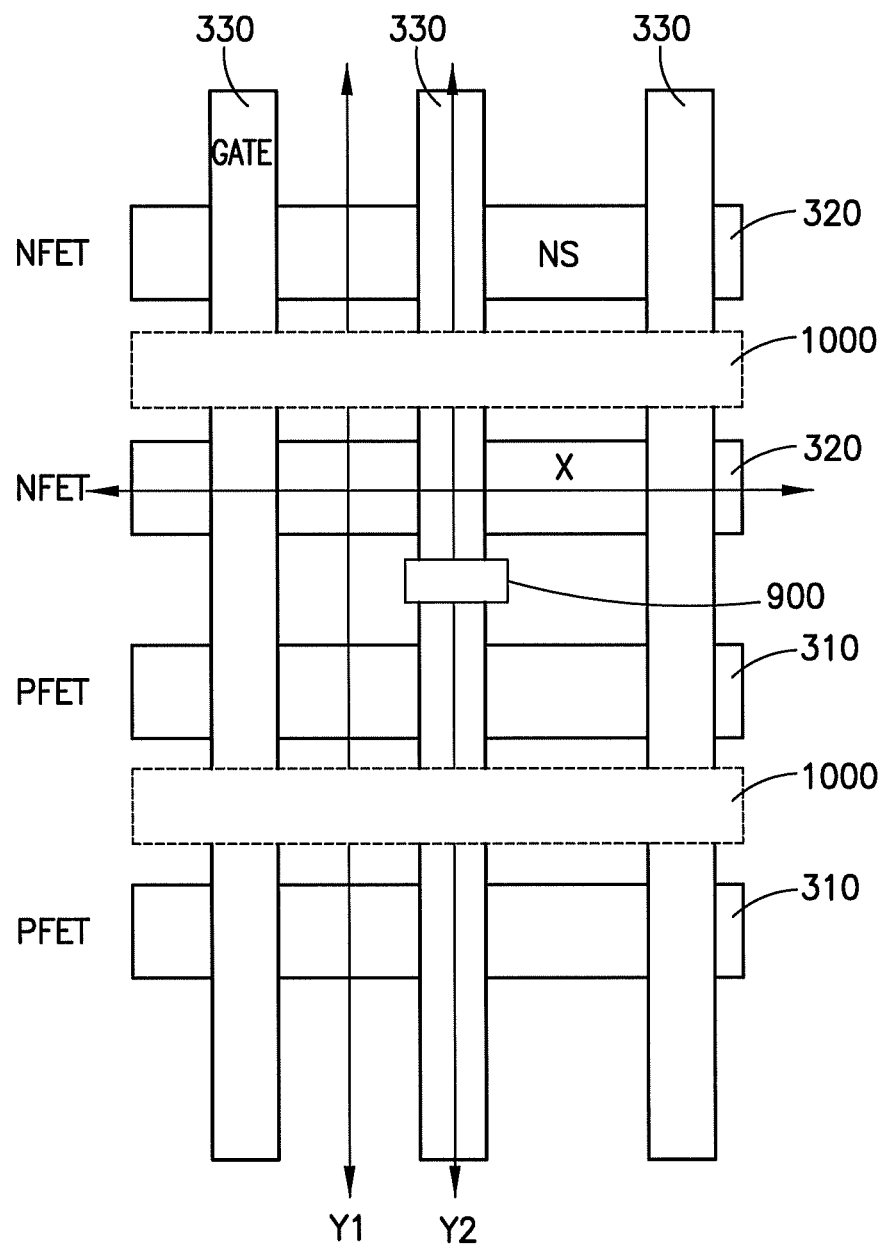
FIG. 10A is a schematic top view of the structure with deep gate cuts.
Figure 10B:
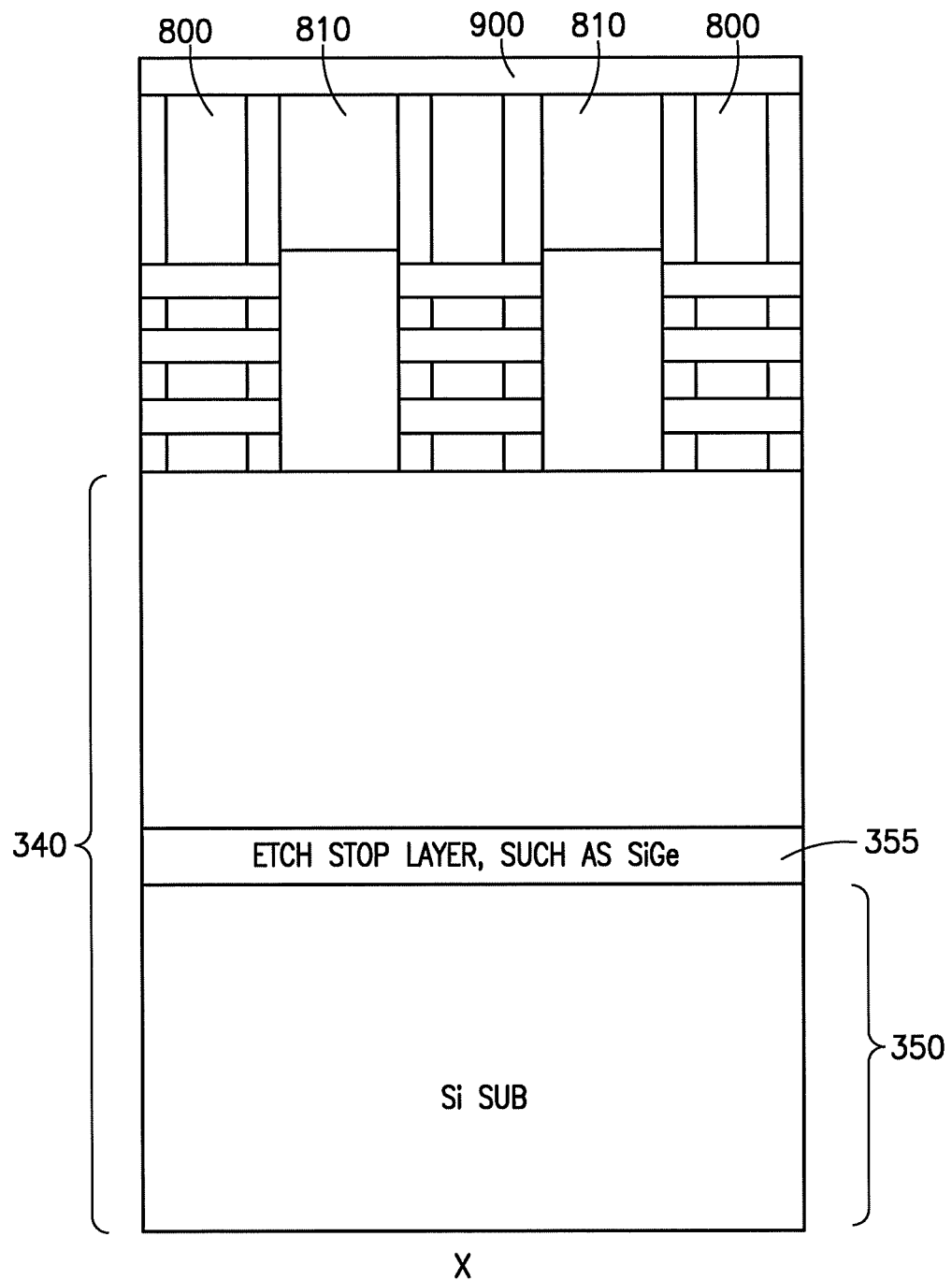
FIG. 10B is a schematic front view of the structure of FIG. 10A.
Figure 10C:
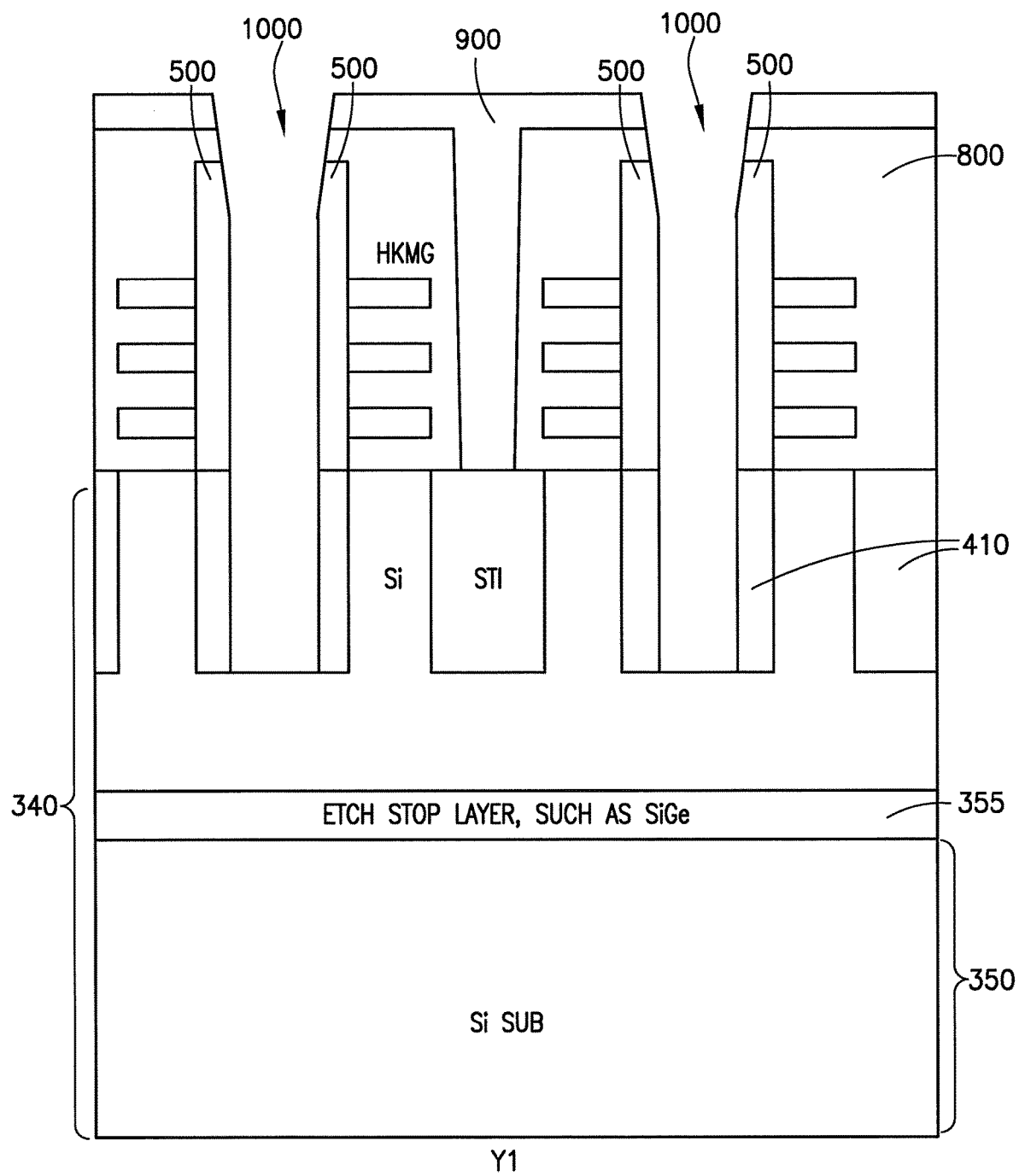
FIGS. 10C and 10D are schematic side views of the structure of FIGS. 10A and 10B.
Figure 10D:
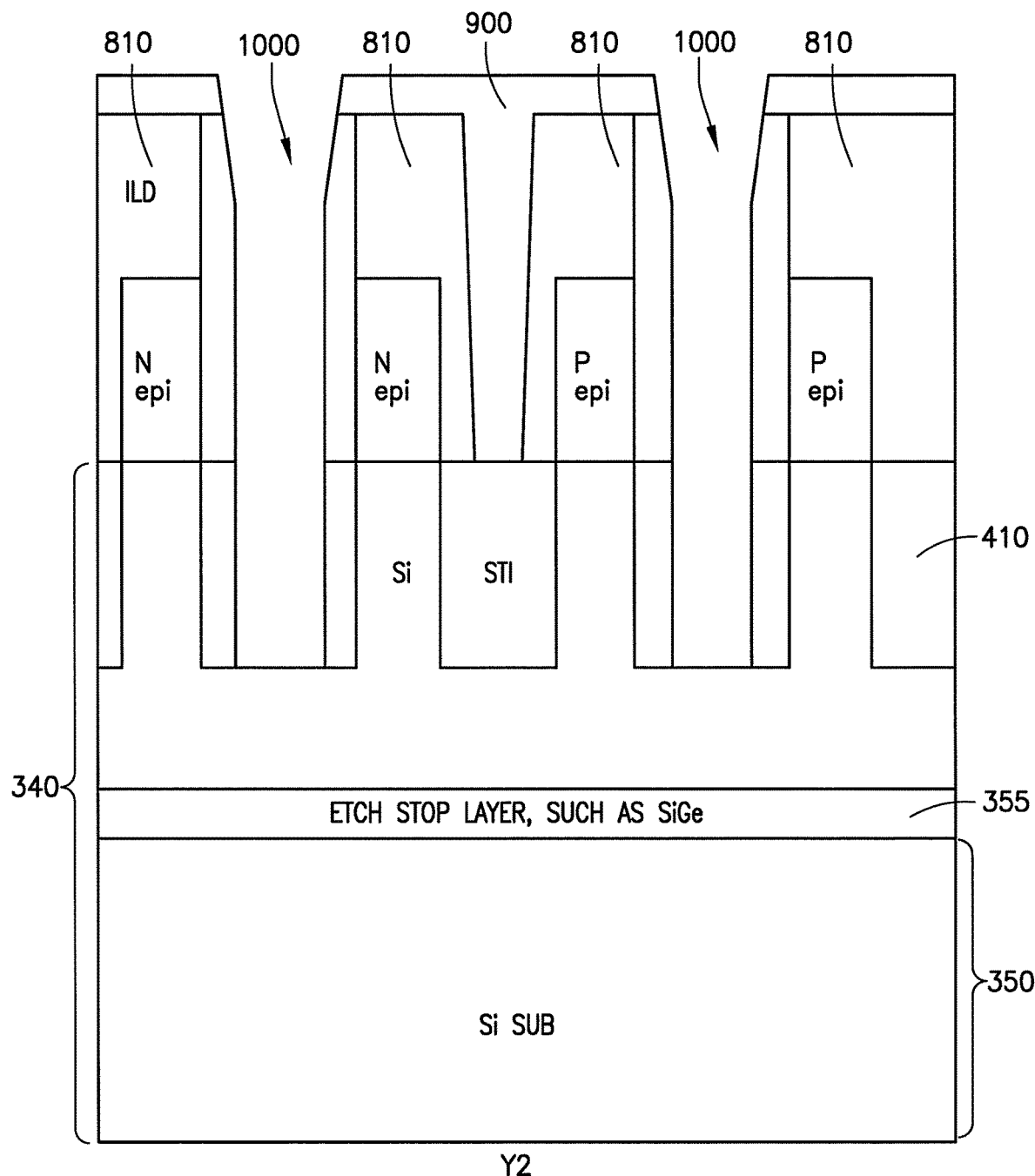
Figure 11A:
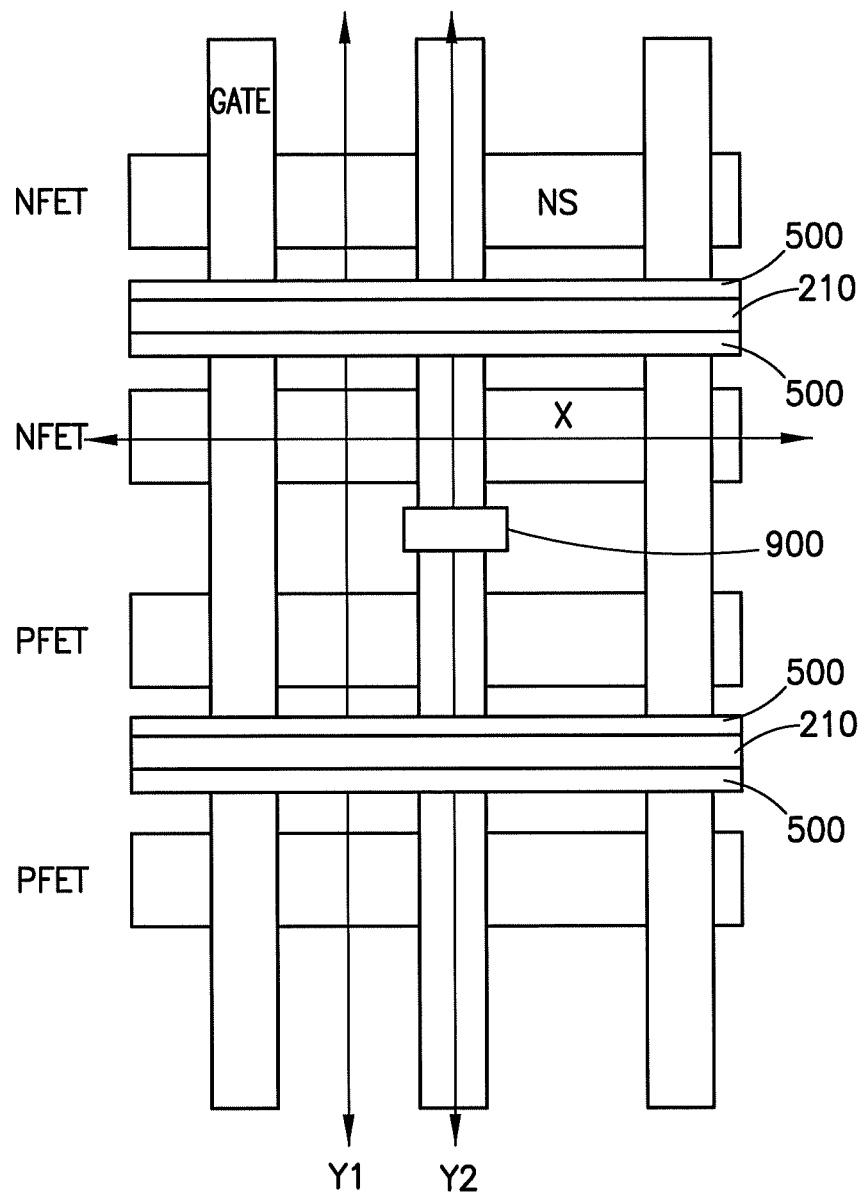
FIG. 11A is a schematic top view of the structure with a frontside power rail metal fill.
Figure 11B:
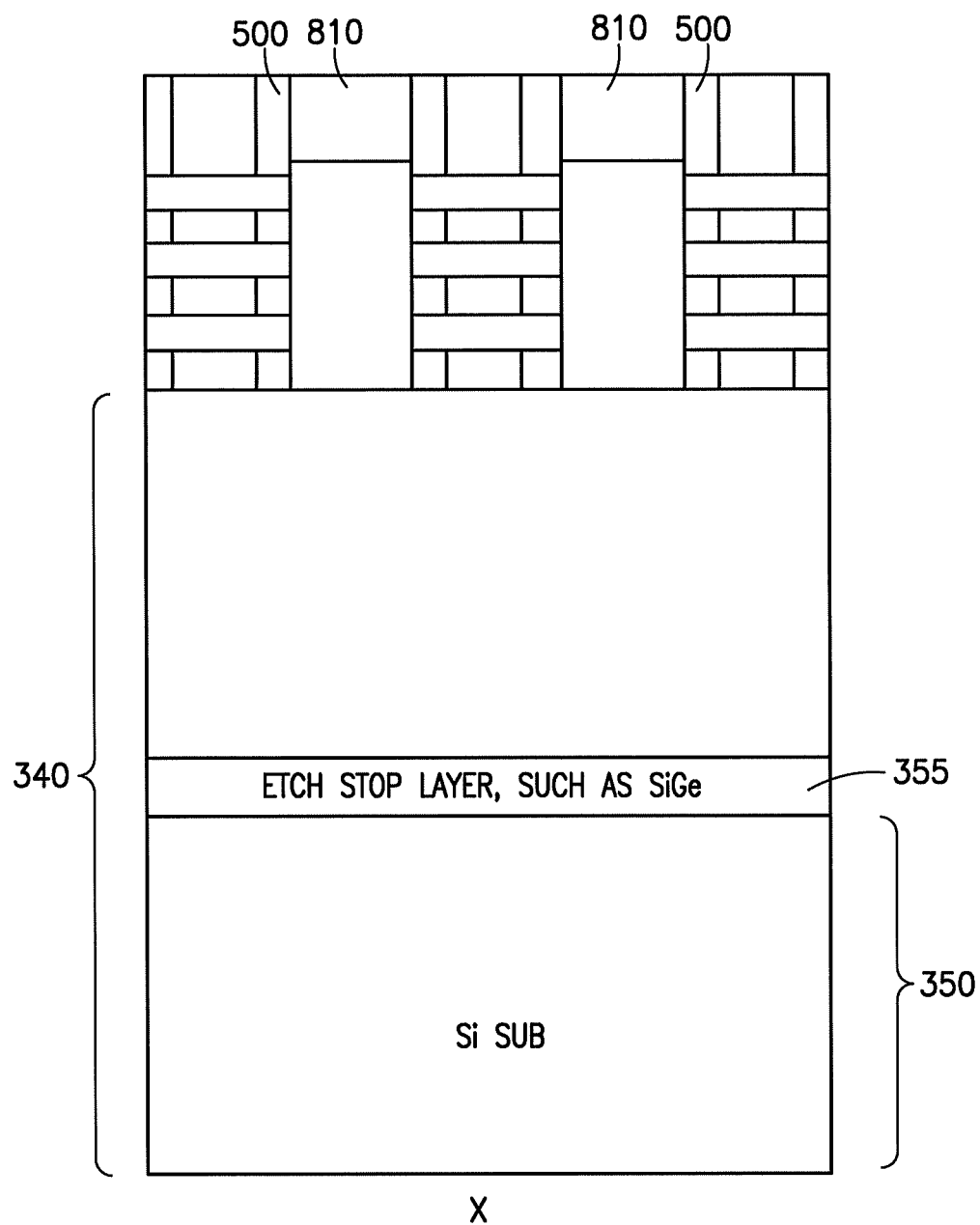
FIG. 11B is a schematic front view of the structure of FIG. 11A.
Figure 11C:
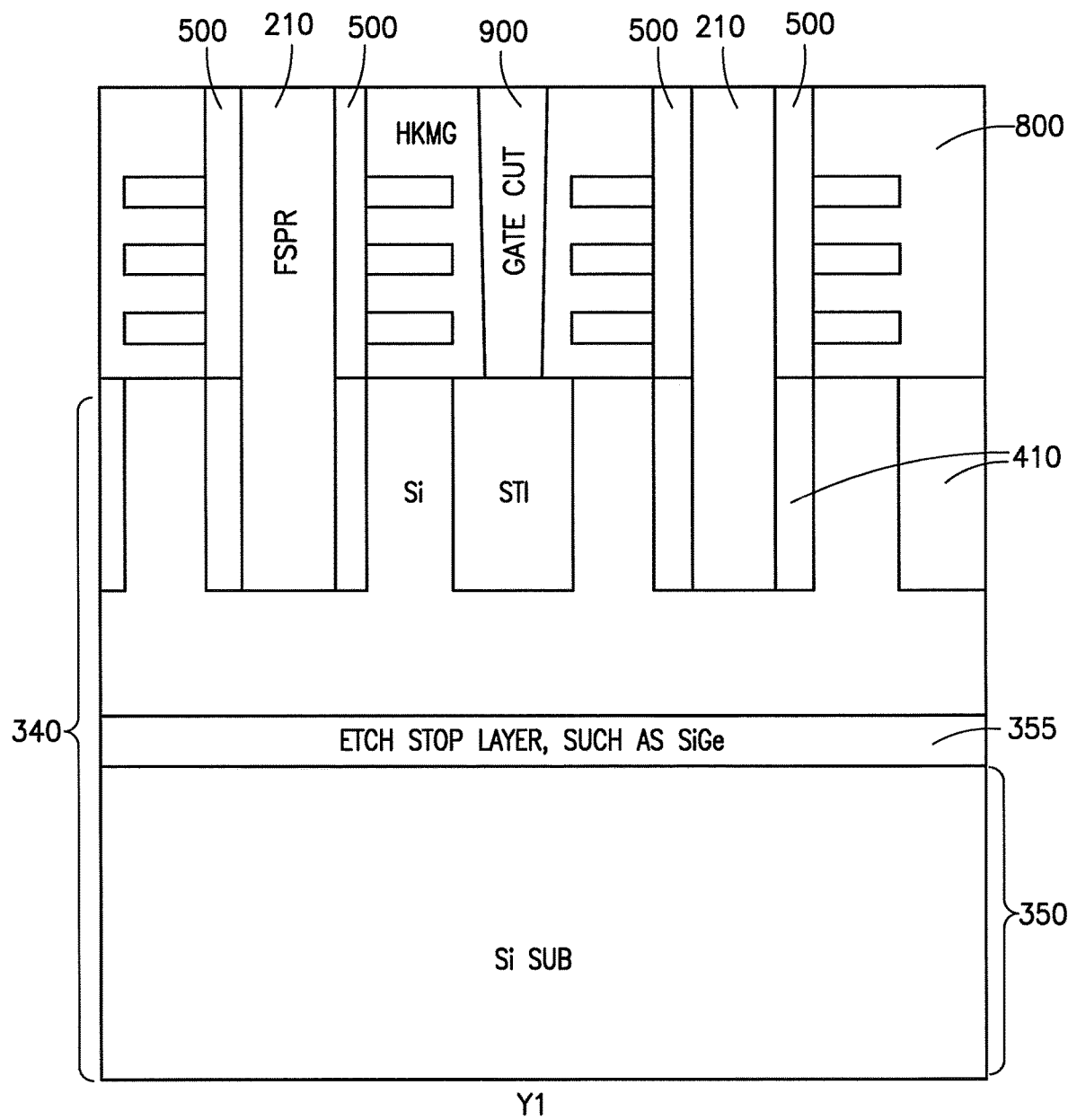
FIGS. 11C and 11D are schematic side views of the structure of FIGS. 11A and 11B.
Figure 11D:
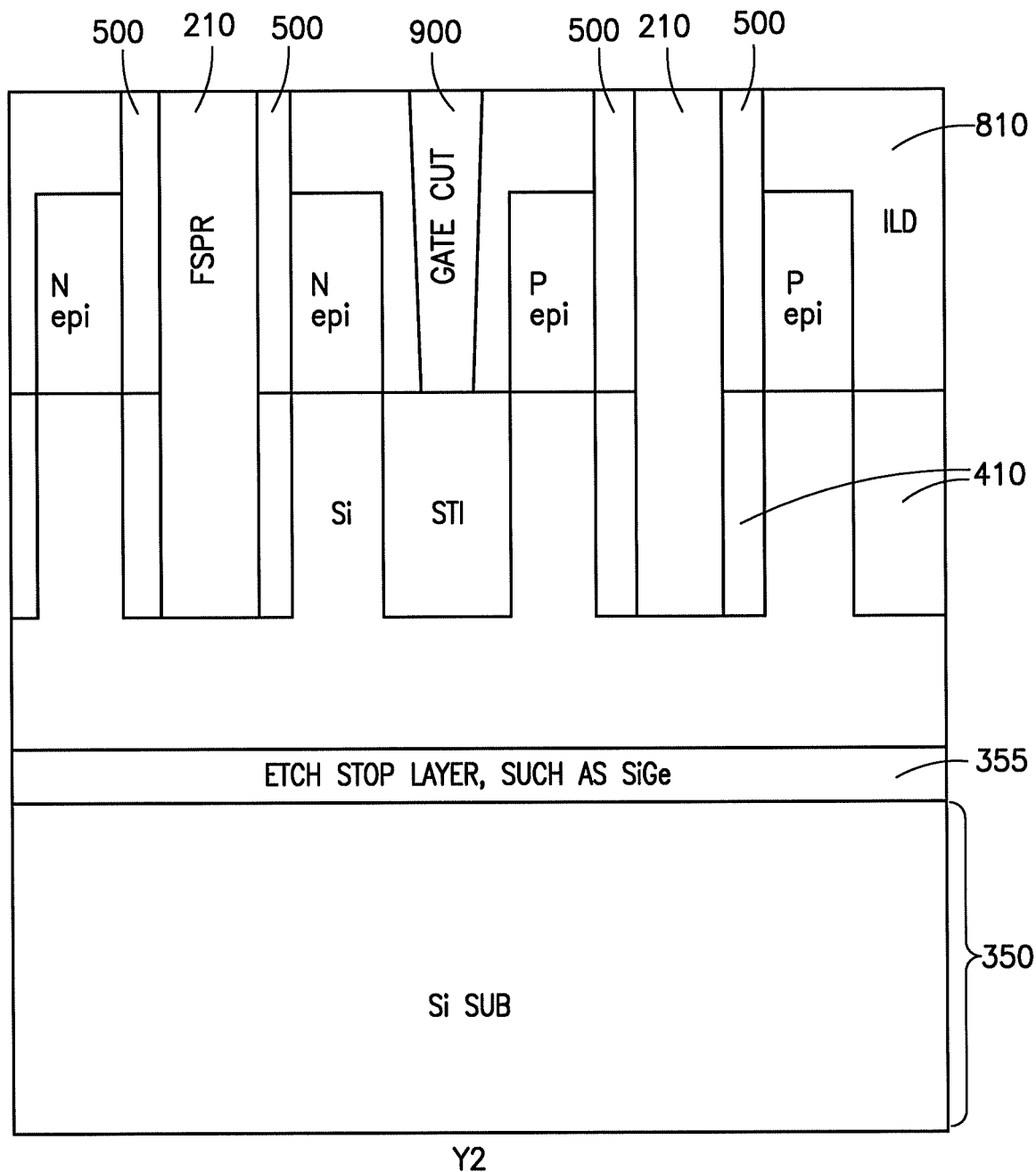

As shown in FIGS. 10A, 10B, 10C, and 10D, a deep gate cut 1000 is formed. Referring to FIG. 10A, deep gate cuts 1000 are made between adjacent PFETs 310 and NFETs 320. The deep gate cuts 1000 extend through the STI 410 to the underlying bulk silicon of the bulk layer 360. As shown in FIGS. 10C and 10D, an etch is used to remove the second dielectric 510, and the material used in the etch being selected so as to etch the second dielectric 510 but to not etch the first dielectric 500.

As shown in FIGS. 11A, 11B, 11C, and 11D, the FSPR 210 is formed in each of the deep gate cuts 1000 by filling the deep gate cuts 1000 with a metal. The first dielectric 500 remains in place to isolate the FSPRs 210 from the channel/gate and source/drain epilayer structures. A CMP process is carried out as necessary. One advantage of such a configuration is that even at 38 nm in the N2N or P2P space, the FSPR 210 width can be reduced to 2 nm without compromising efficiency, as compared to previous configurations.

Figure 12A:
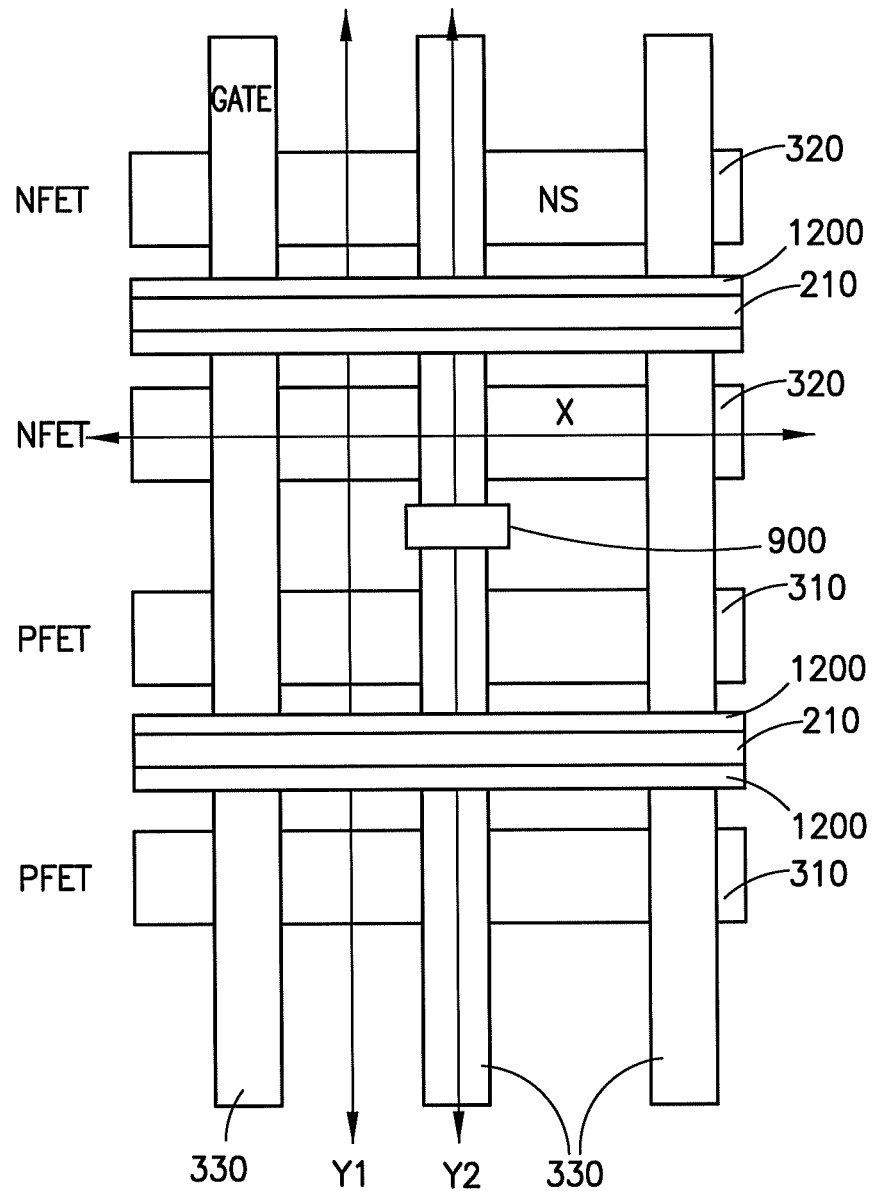
FIG. 12A is a schematic top view of the structure showing formation of a via-connect buried power rail to connect source/drain regions to the frontside power rail.
Figure 12B:
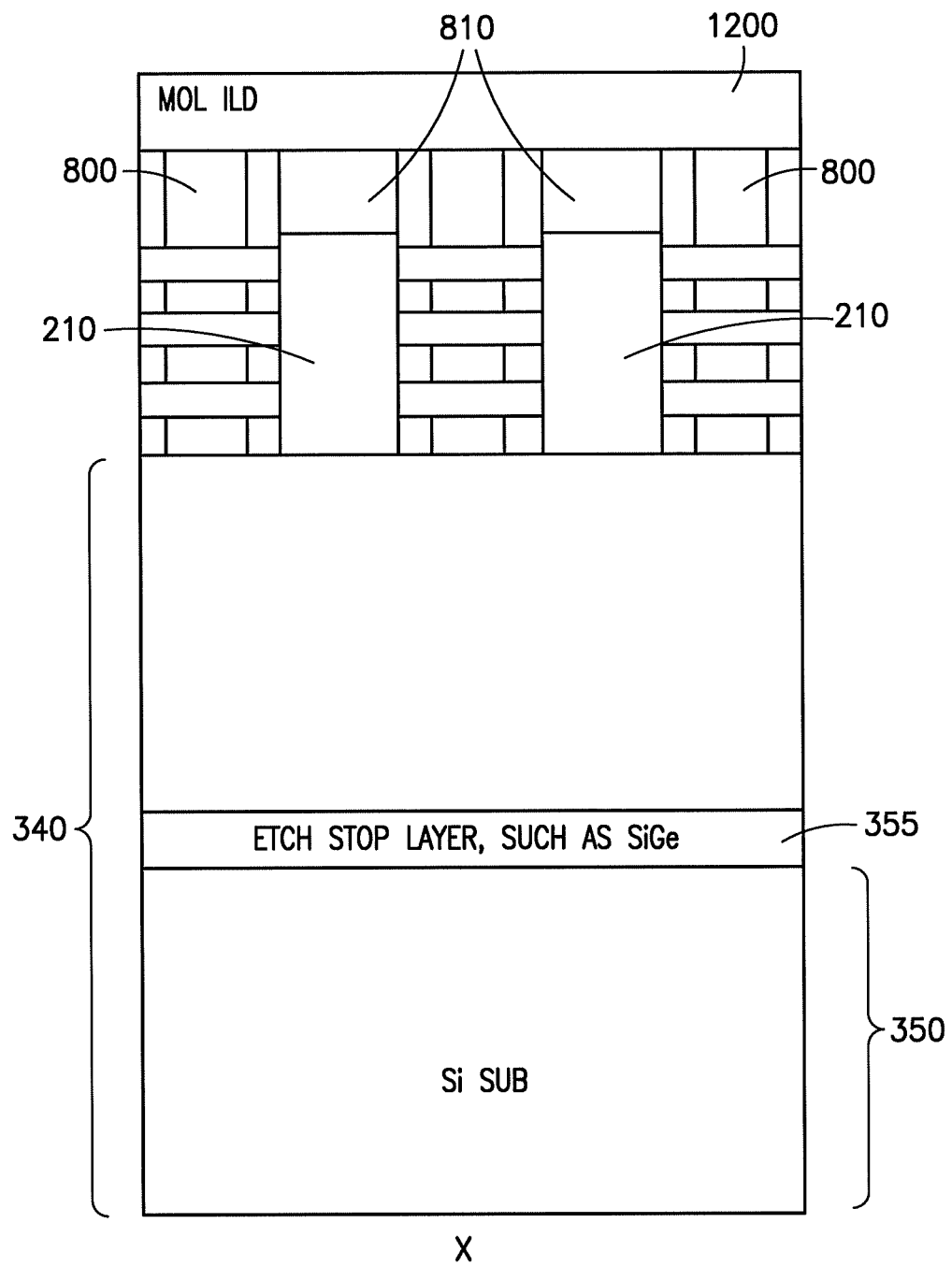
FIG. 12B is a schematic front view of the structure of FIG. 12A.
Figure 12C:
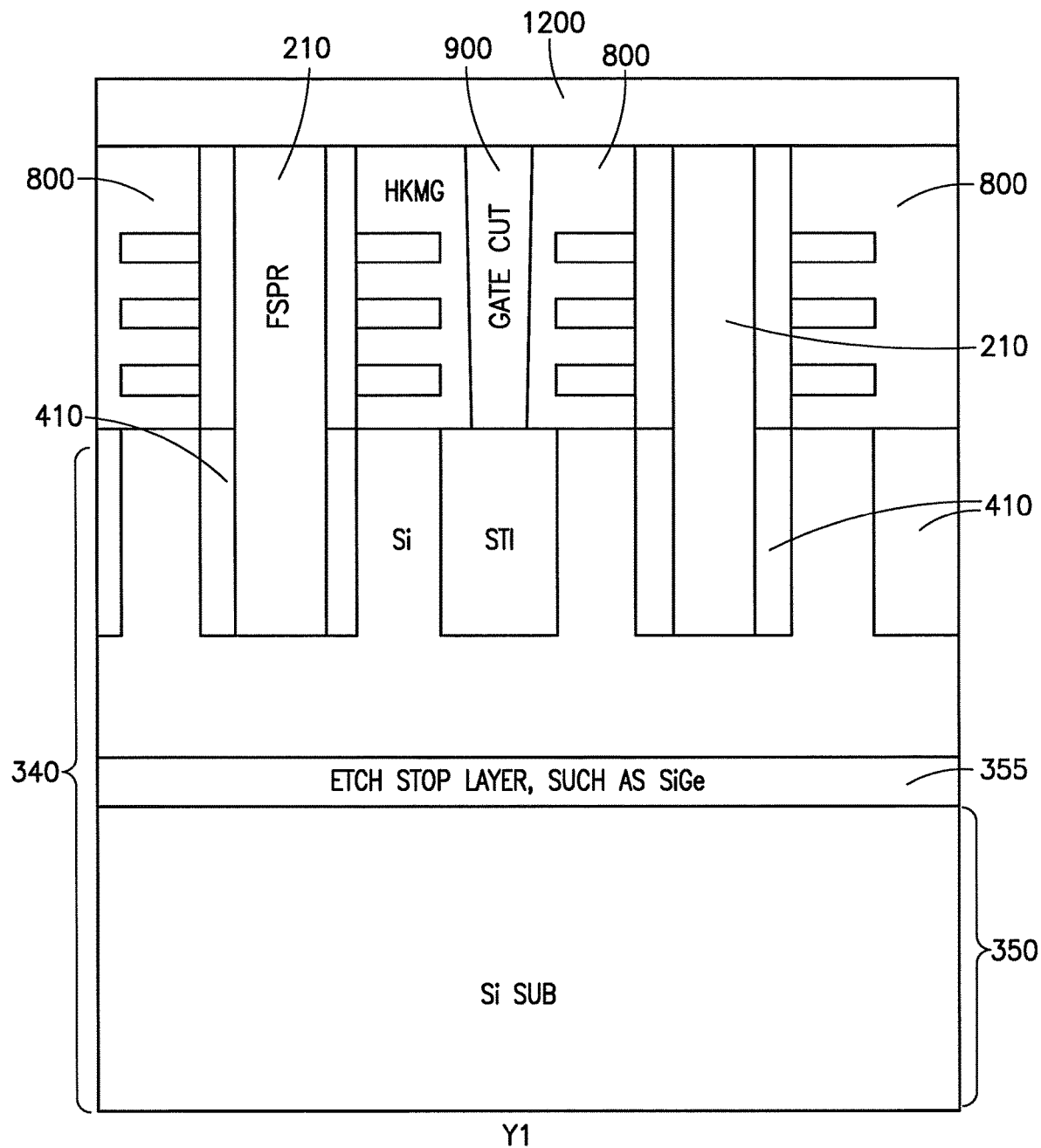
FIGS. 12C and 12D are schematic side views of the structure of FIGS. 12A and 12B.
Figure 12D:
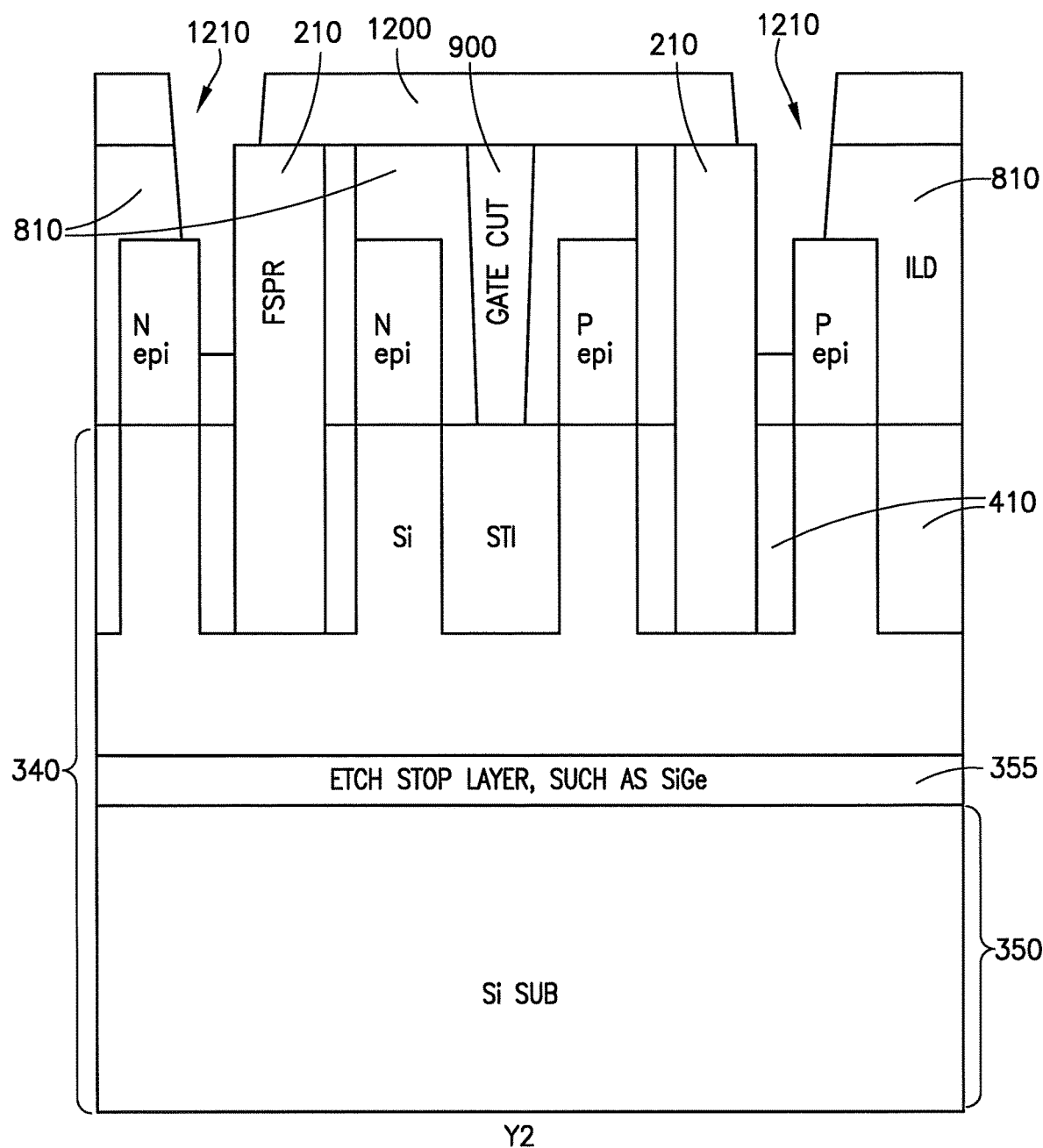

As shown in FIGS. 12A, 12B, 12C, and 12D, a middle-of-the-line interlayer dielectric 1200 (MOL ILD 1200) is deposited onto upper surfaces. As shown in FIG. 12D, openings 1210 are formed through the MOL ILD 1200 and through the first dielectric 500 for subsequent connections of the epilayers and source/drain contacts to the corresponding FSPRs 210.

Figure 13A:
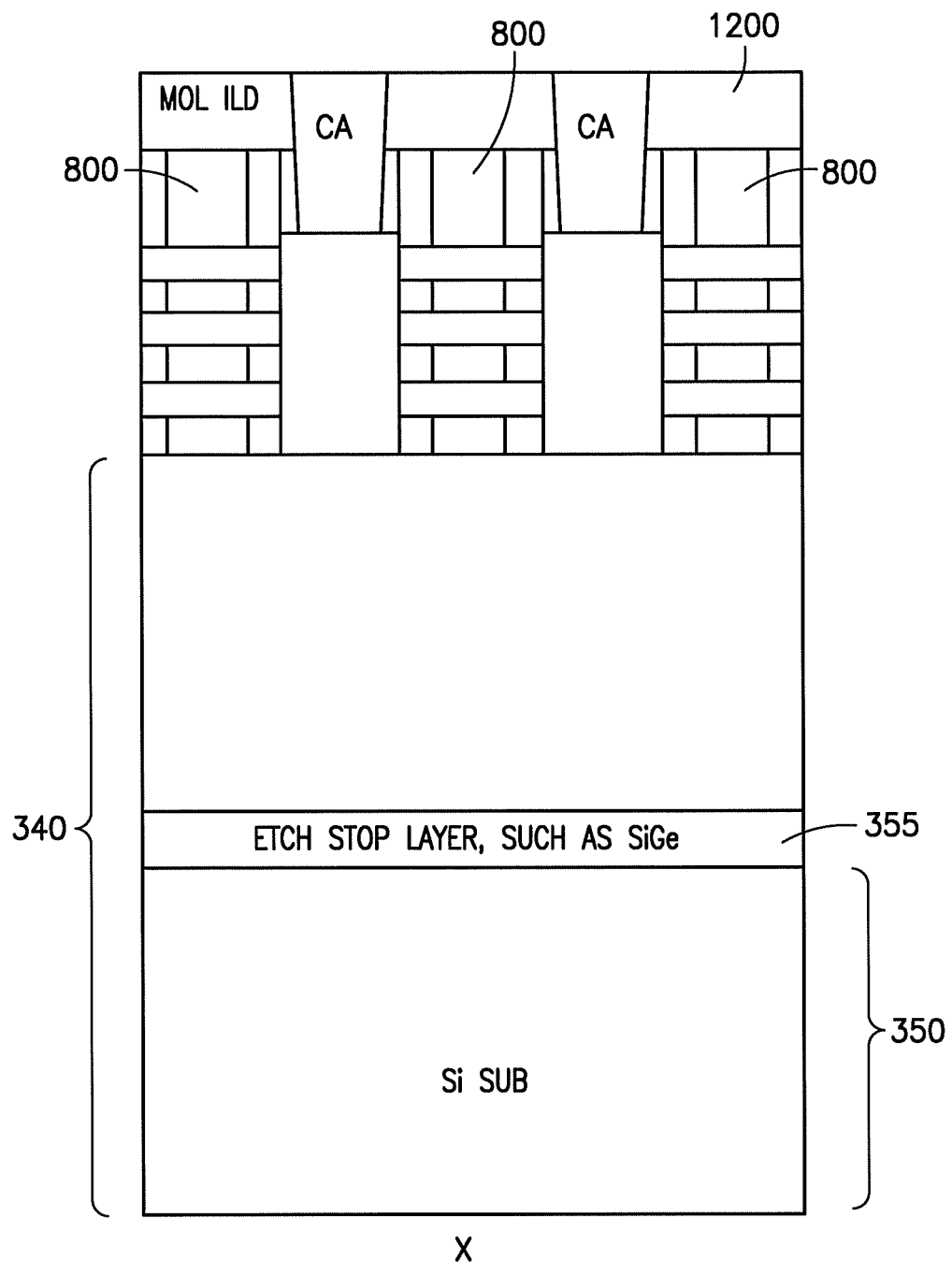
FIG. 13A is a front schematic view of the structure showing formation of middle-of-line patterning and metallization.
Figure 13B:
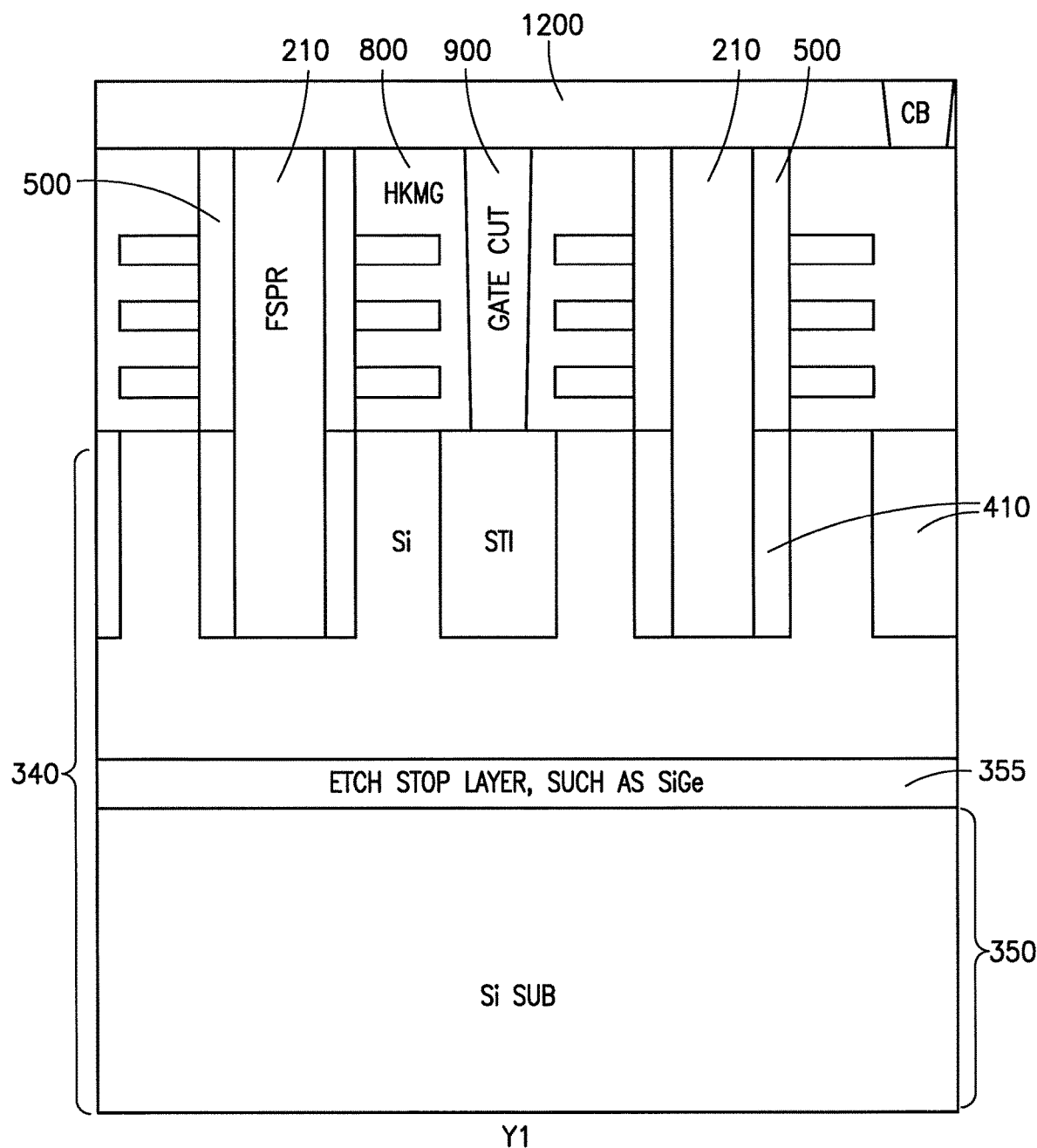
FIGS. 13B and 13C are side schematic views of the structure of FIG. 13A.
Figure 13C:
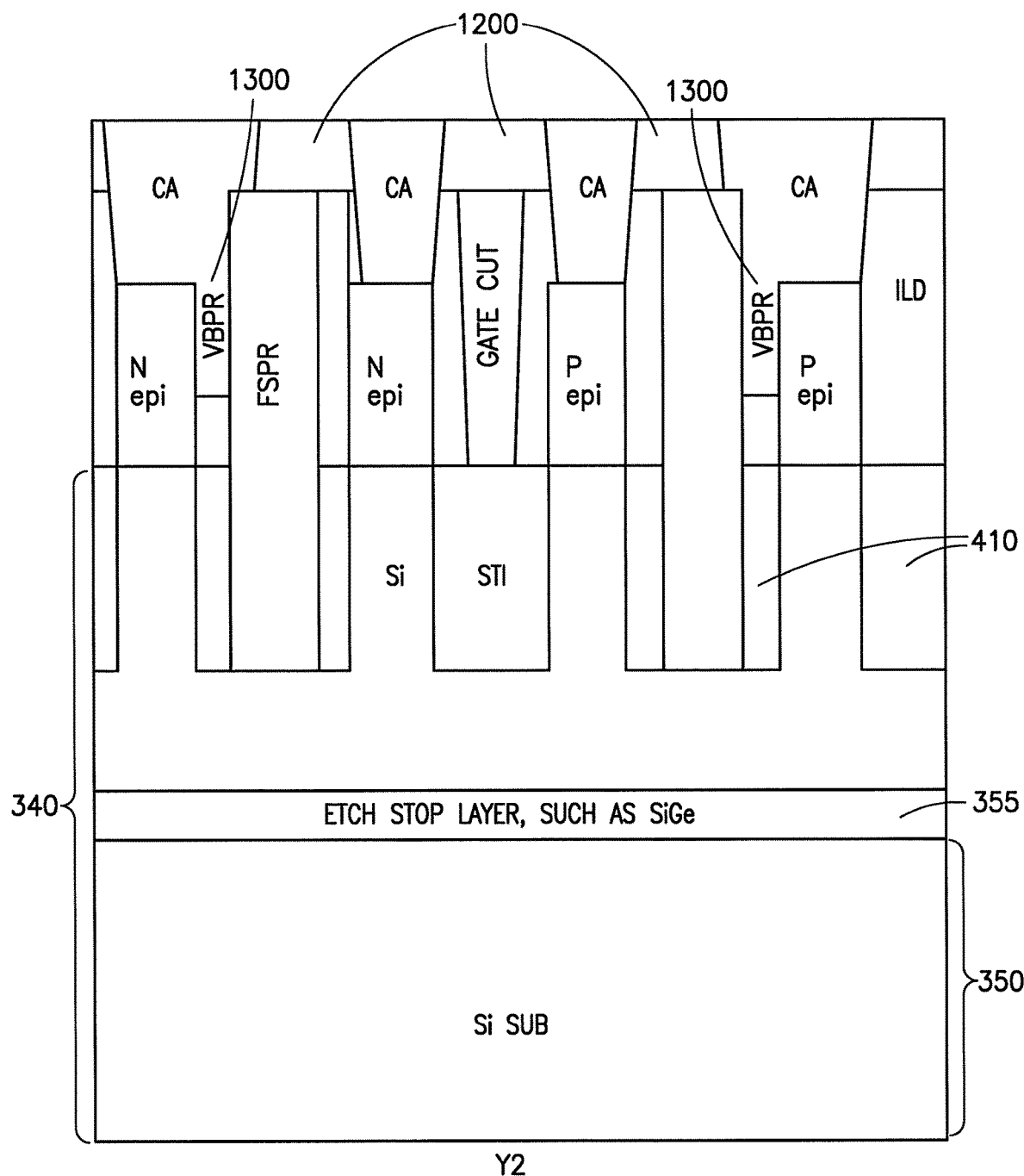

As shown in FIGS. 13A, 13B, and 13C, the openings 1210 are filled with metal to form VBPRs 1300 and contacts CA to the VBPRs 1300 and/or PFET and NFET layers. Additional openings may be formed and filled with metal to form contacts CB to source/drain regions or the like. In doing so, three surfaces of the channel are wrapped around by the HKMG 800 (tri-gate device), where one side of the channel region directly contacts the first dielectric 500 and is not covered by the HKMG 800. Thus, as indicated in FIGS. 11A-13C, the FSPRs 210 are formed in deep gate cut regions, and VBPR connections are then made between the FSPRs 210 and epitaxial layers forming the source/drain regions. The embodiments disclosed can advantageously be used in place of configurations that employ narrower VBPR structures that may provide high resistance paths and bottlenecks and can also be used when the N2N/P2P space is reduced.

Figure 14A:
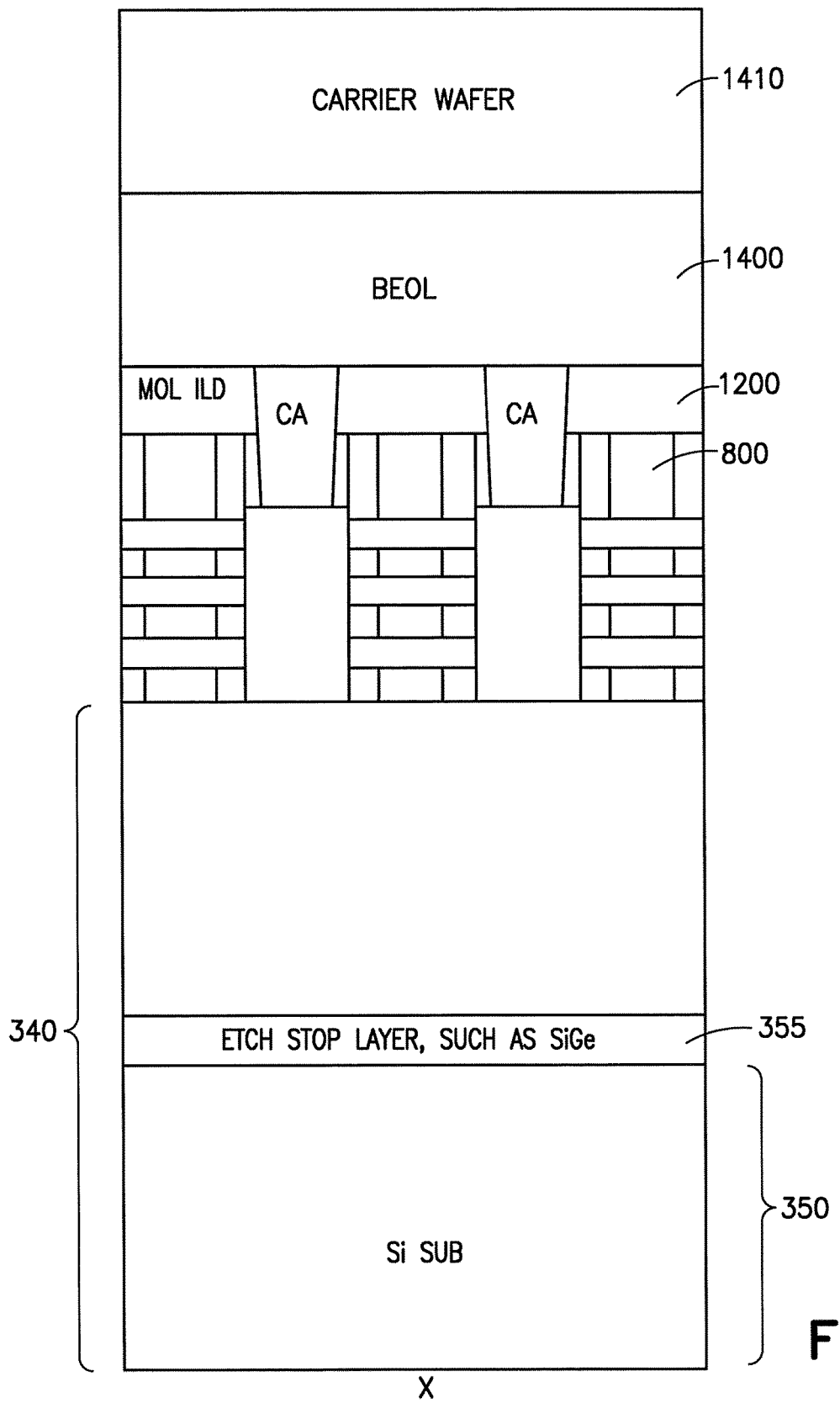
FIG. 14A is a schematic front view of the structure during back-end-of-line patterning and carrier wafer bonding.
Figure 14B:
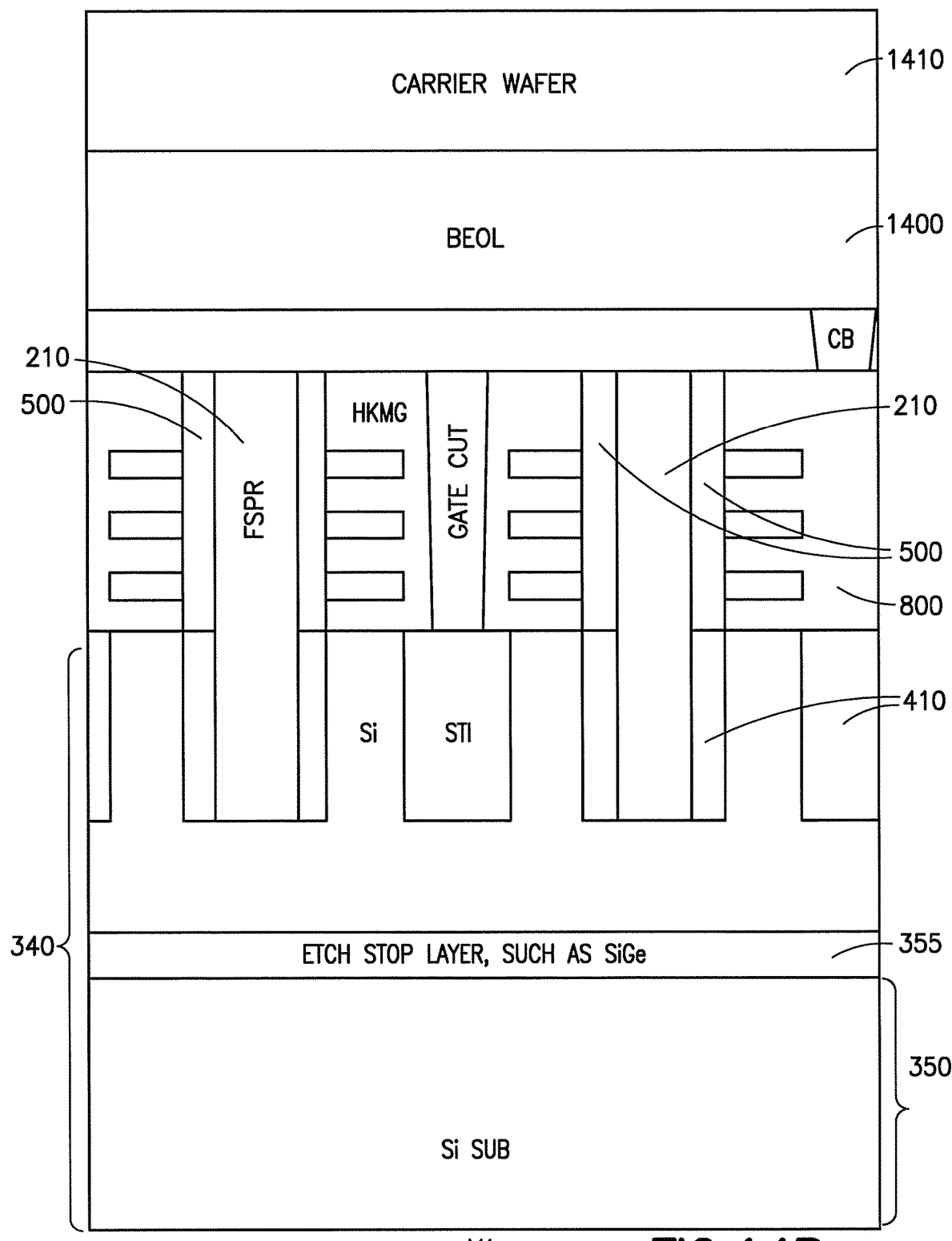
FIGS. 14B and 14C are schematic side views of the structure of FIG. 14A.
Figure 14C:
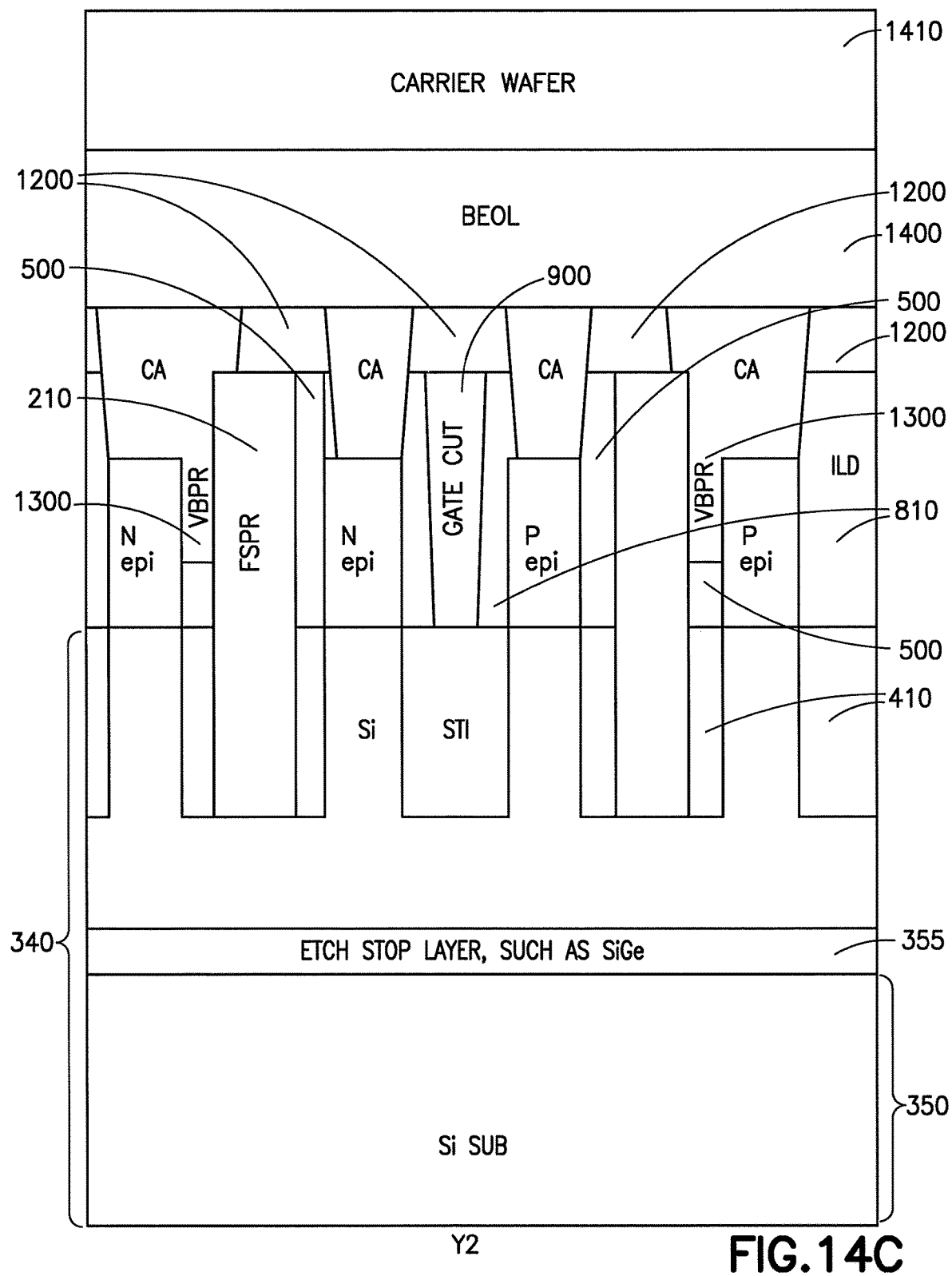

As shown in FIGS. 14A, 14B, and 14C, a back-end-of-line layer 1400 (BEOL layer 1400) is formed on the MOL ILD 1200 and over the exposed contacts CA and contacts CB. A carrier wafer 1410 is bonded to the BEOL layer 1400.

Figure 15A:
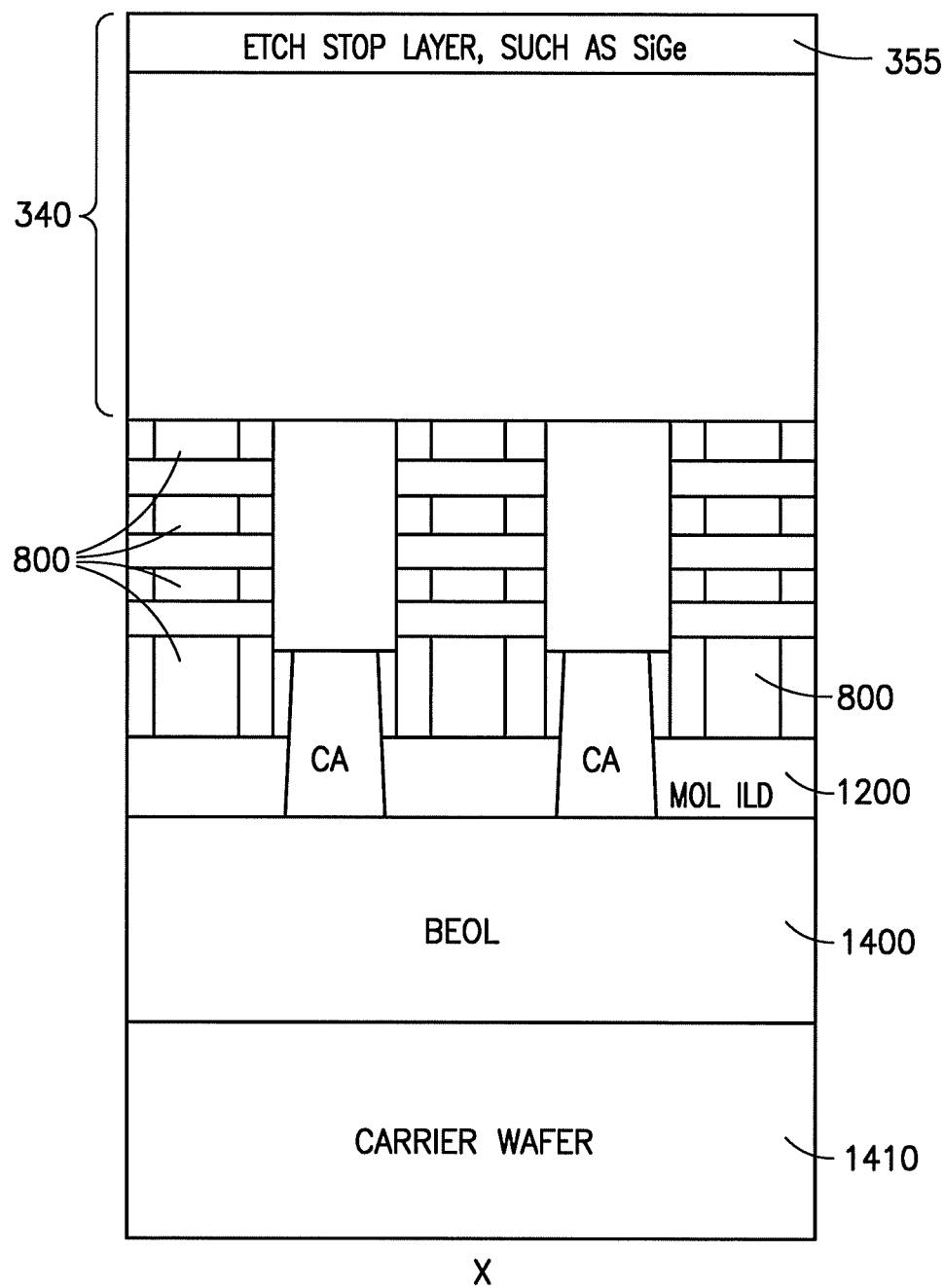
FIG. 15A is a schematic front view of the structure after wafer flip and substrate removal.
Figure 15B:
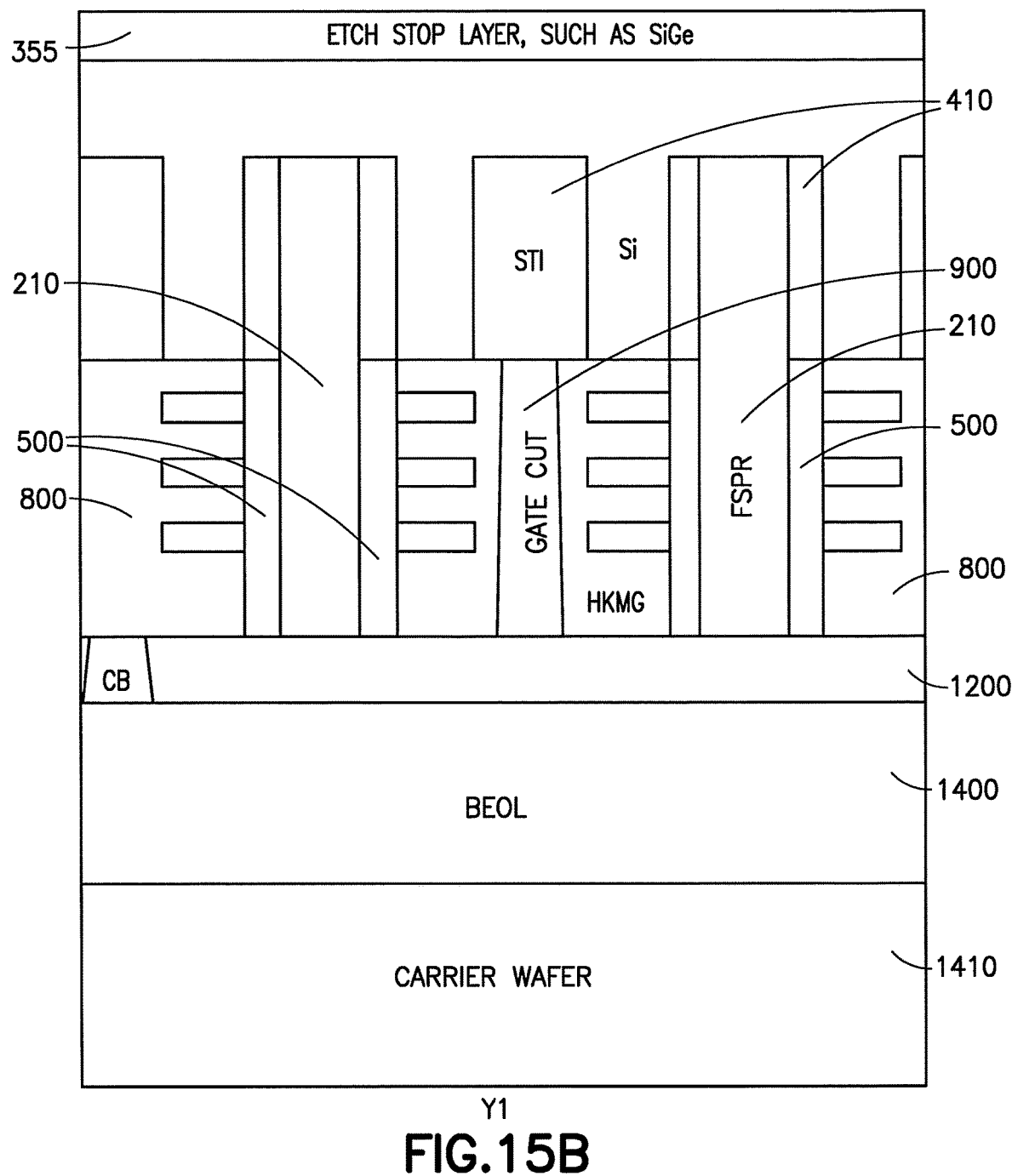
FIGS. 15B and 15C are schematic side views of the structure of FIG. 15A.
Figure 15C:
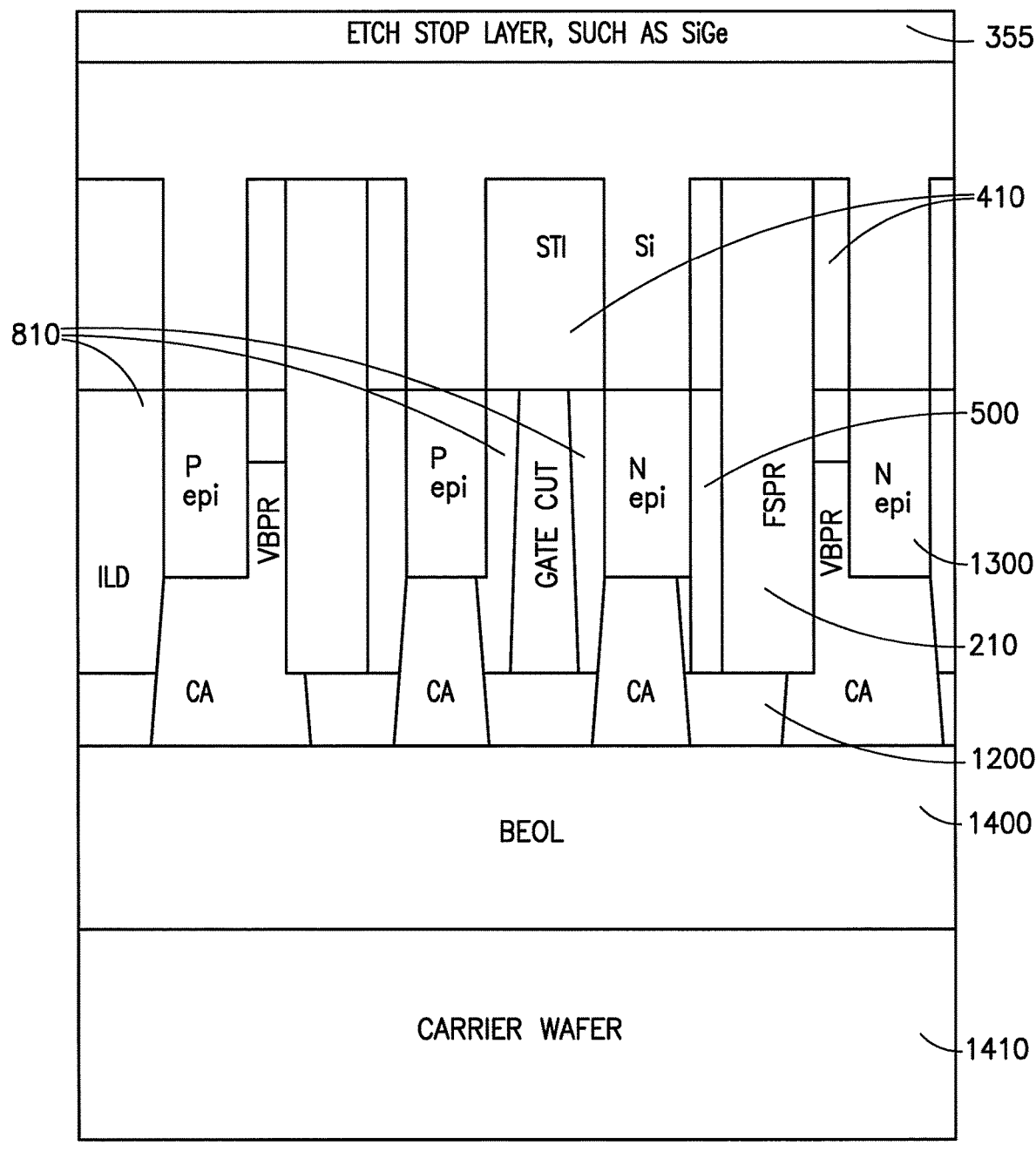

As shown in FIGS. 15A, 15B, and 15, the structure is flipped and the silicon substrate 350 is removed to expose the etch stop layer 355.

Figure 16A:
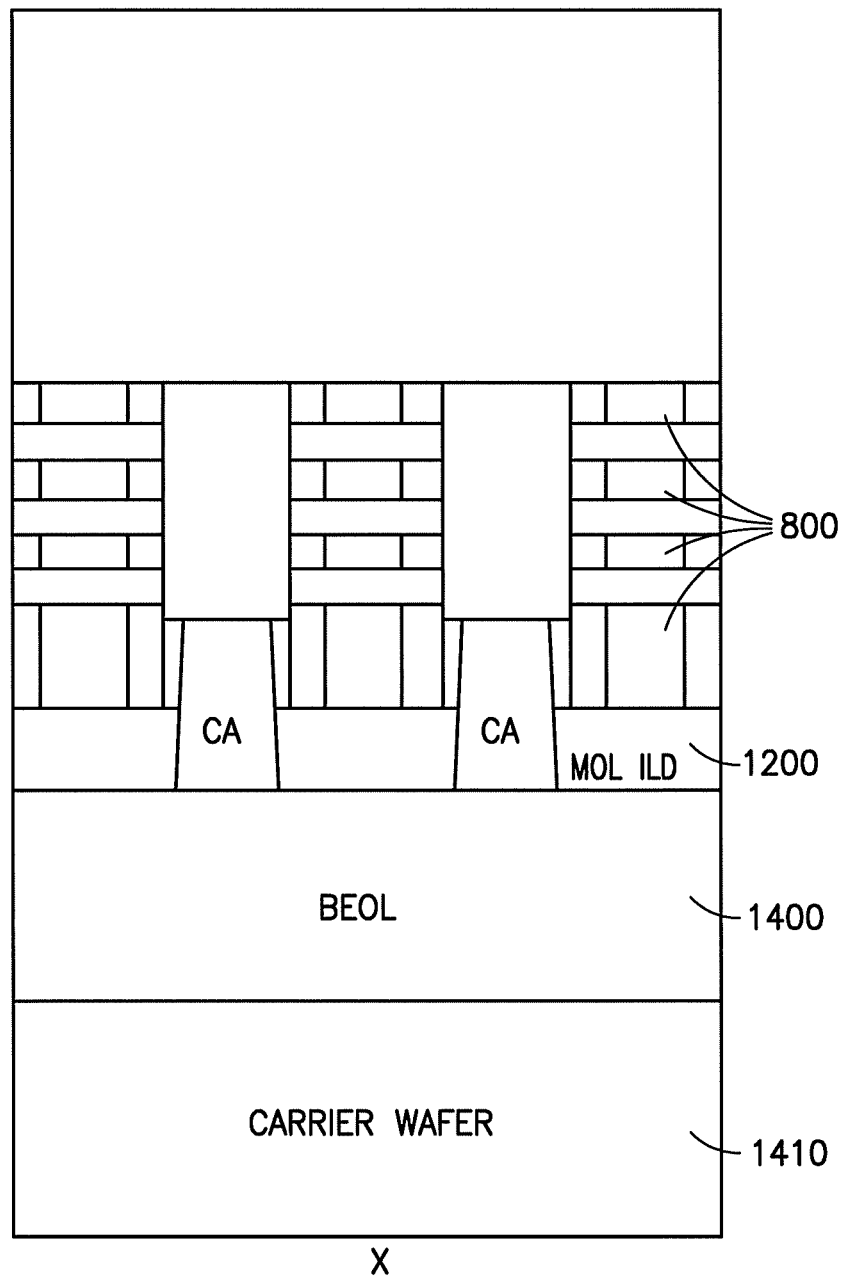
FIG. 16A is a schematic front view of the structure after etch stop layer removal.
Figure 16B:
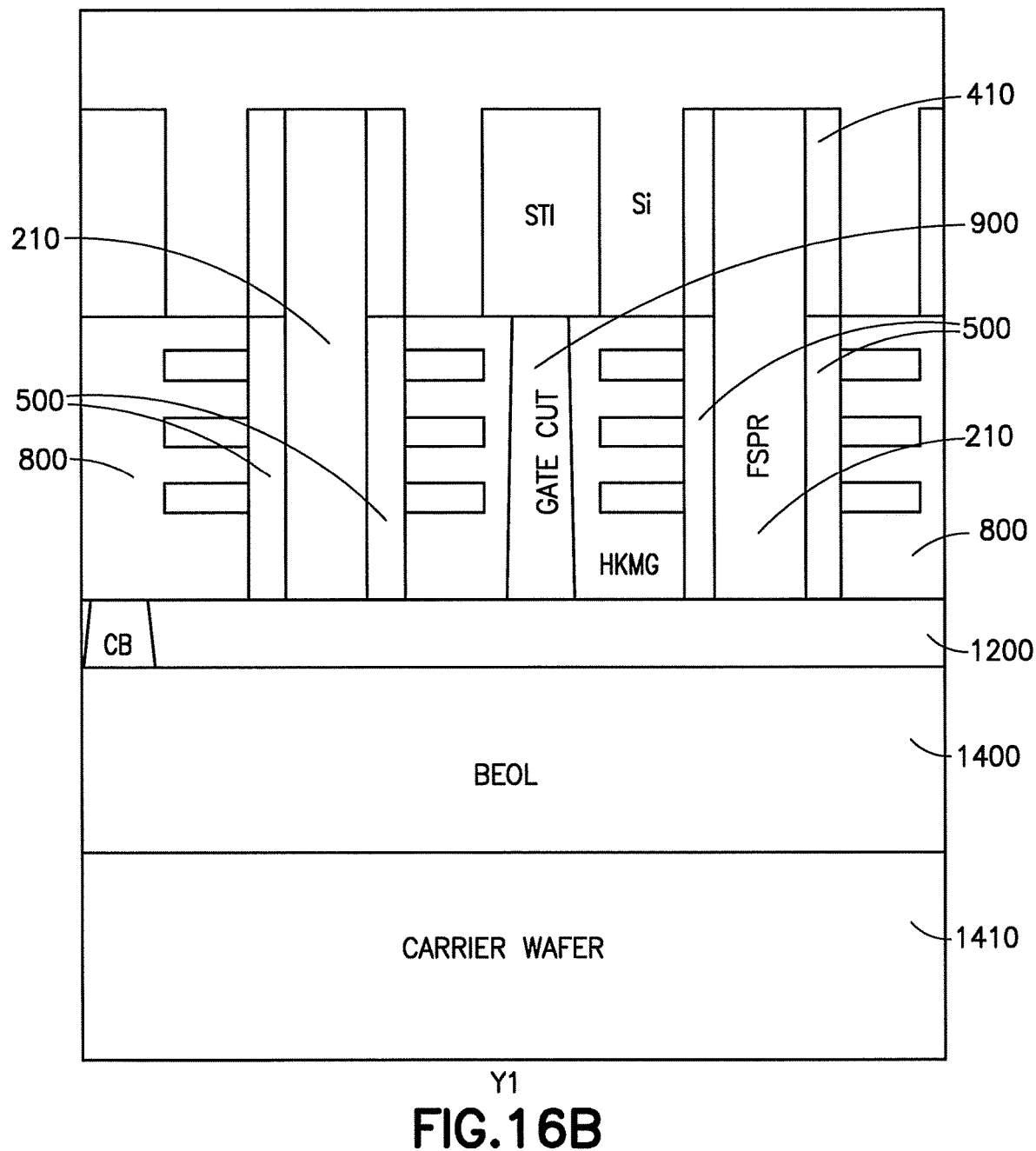
FIGS. 16B and 16C are schematic side views of the structure of FIG. 16A.
Figure 16C:
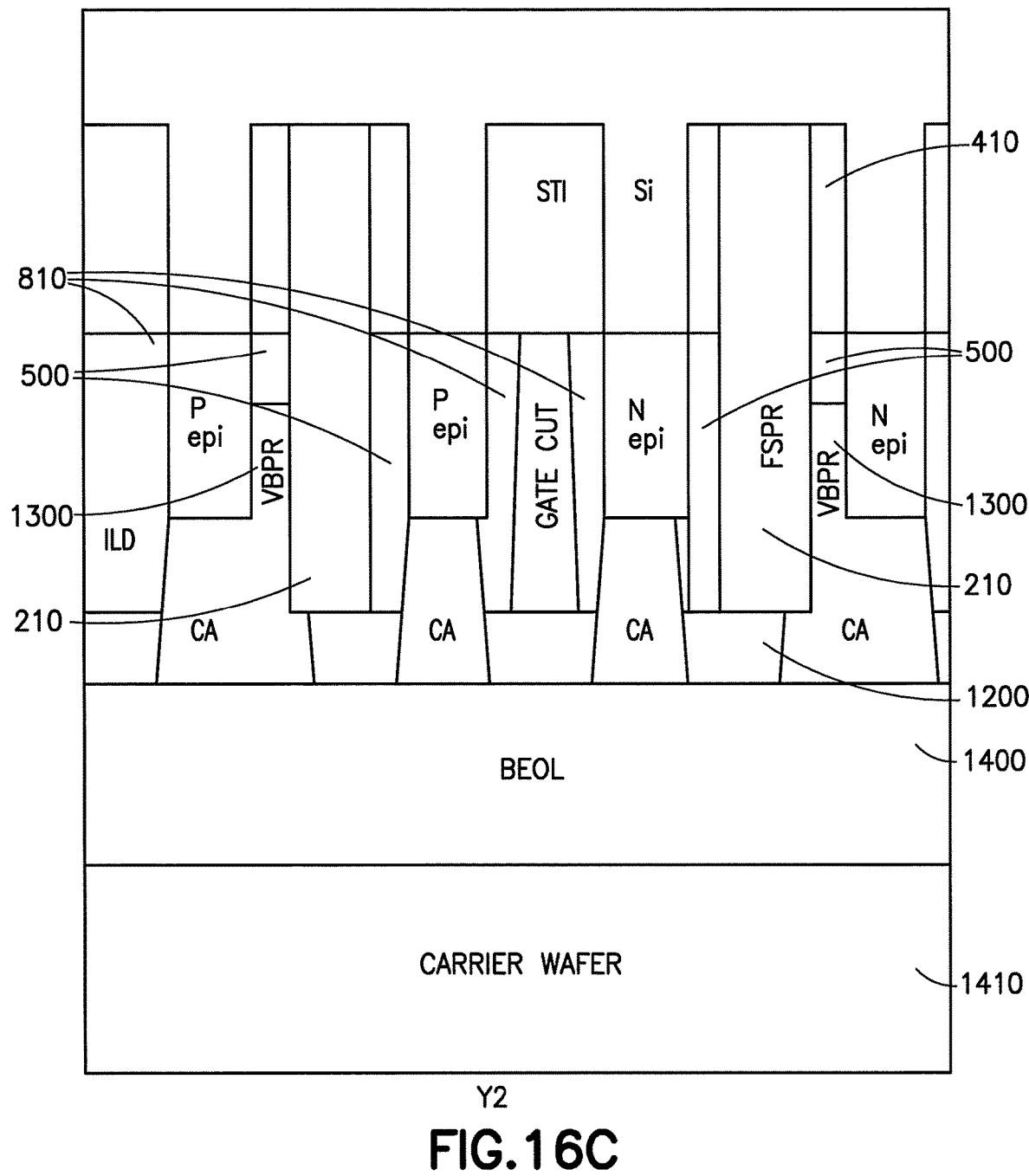

As shown in FIGS. 16A, 16B, and 16C, the etch stop layer 355 is removed.

Figure 17A:
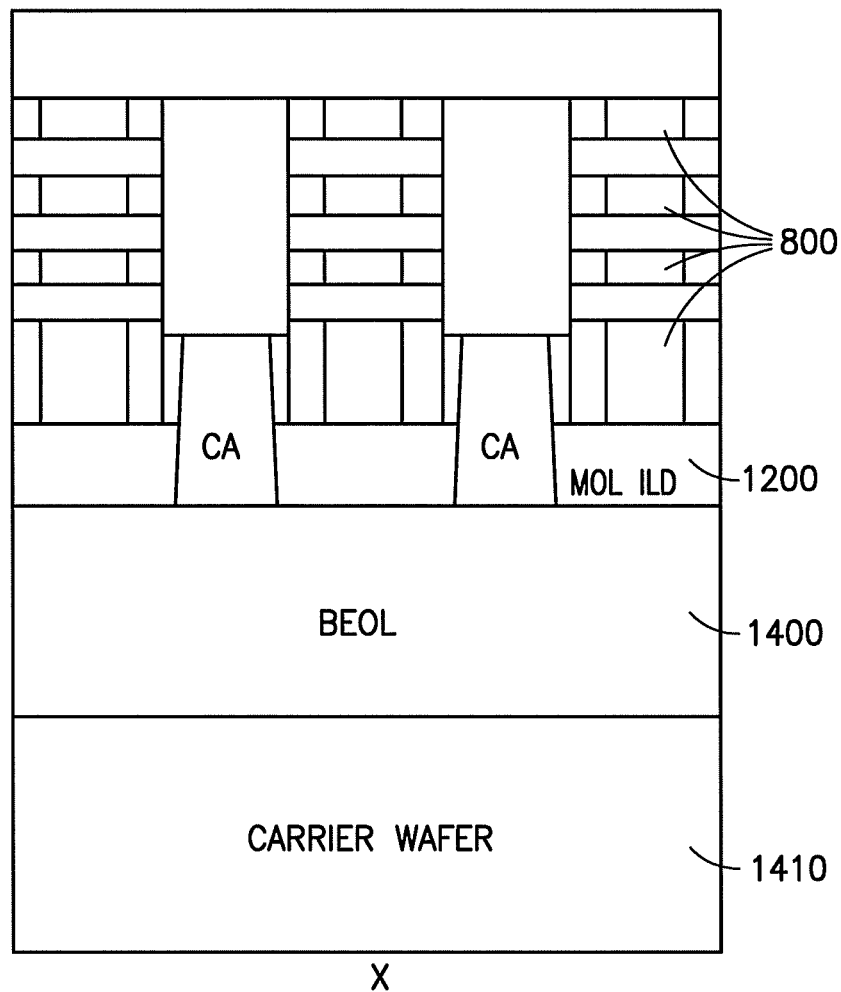
FIG. 17A is a schematic front view of the structure showing silicon recessing.
Figure 17B:
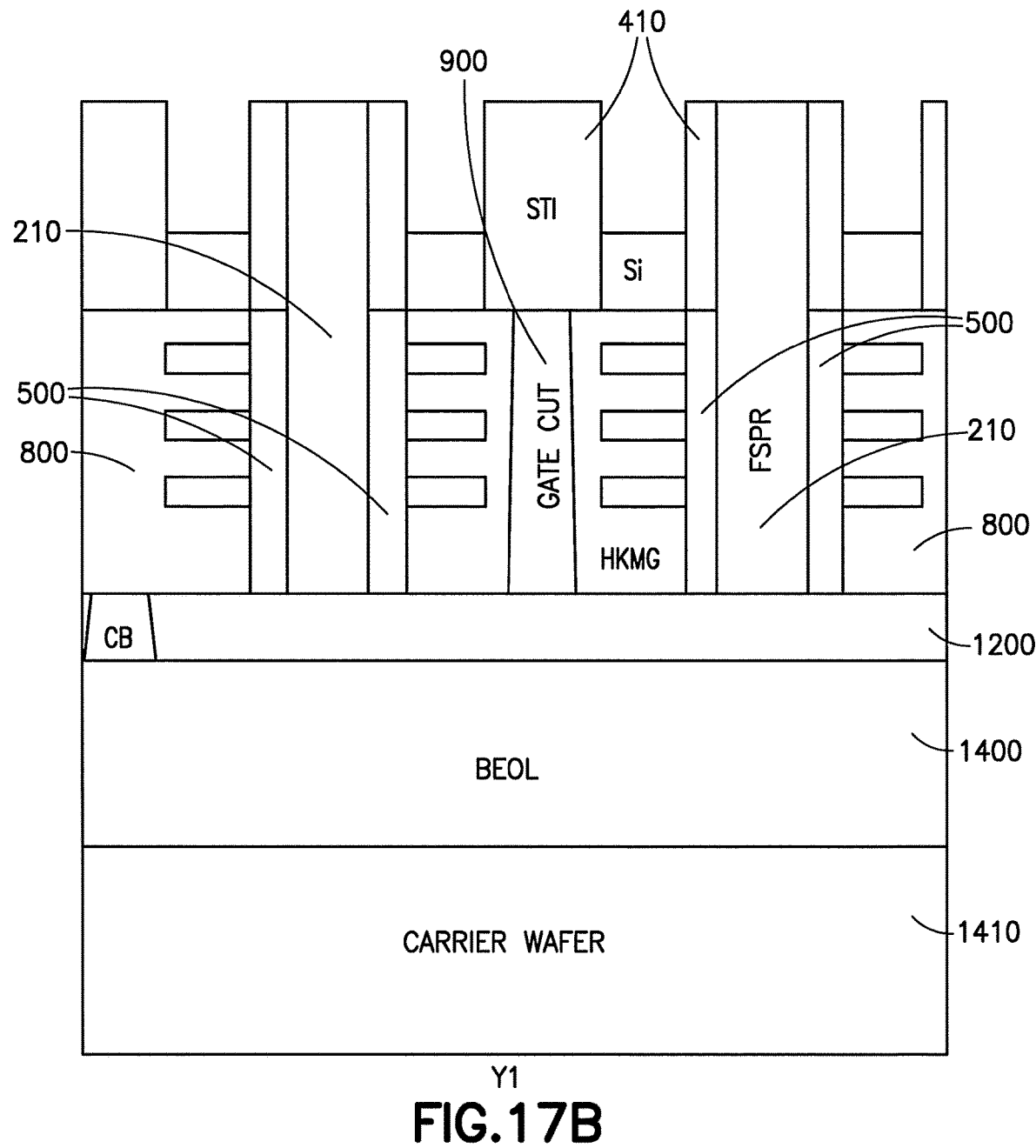
FIGS. 17B and 17C are schematic side views of the structure of FIG. 17A.
Figure 17C:
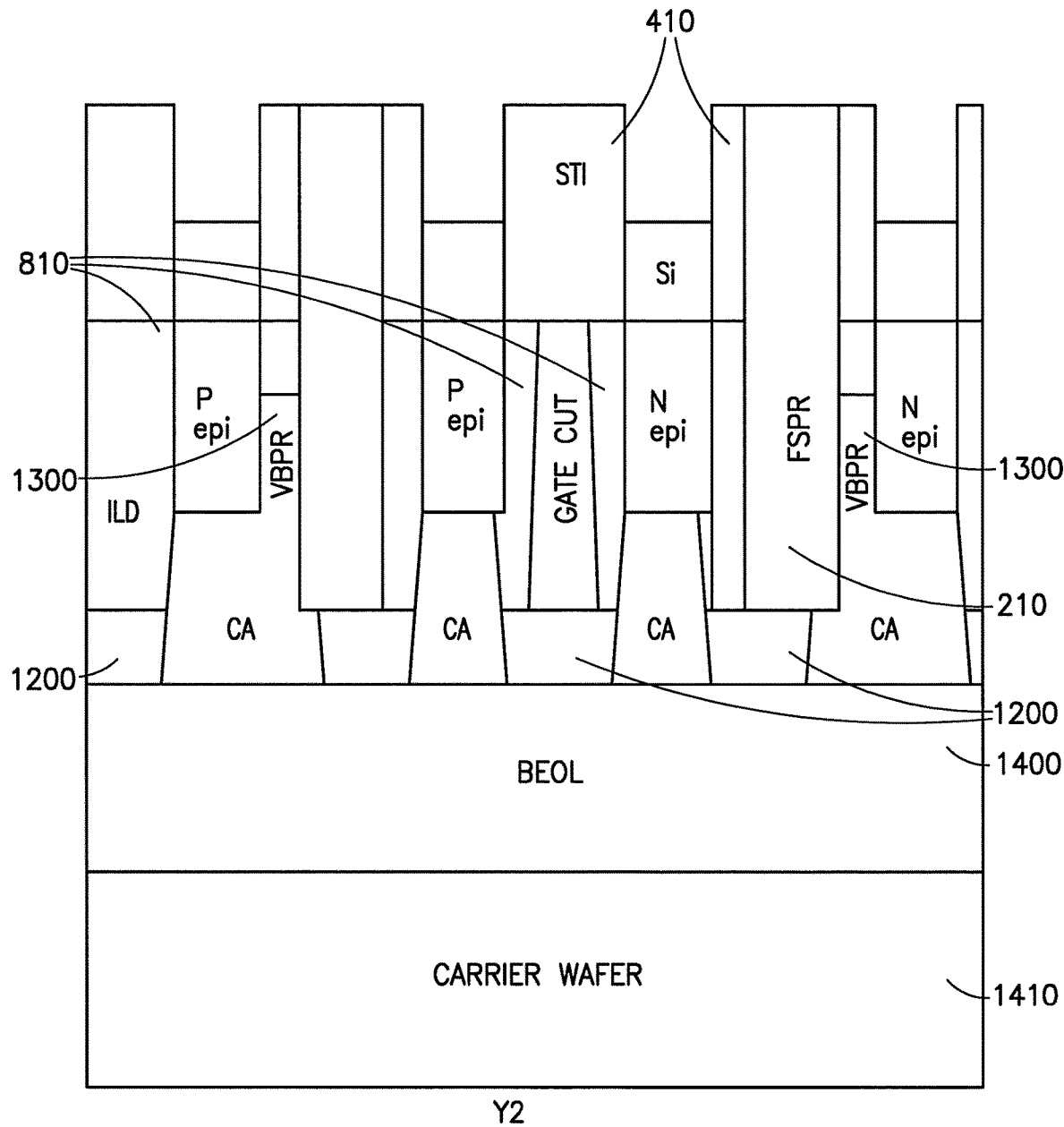

As shown in FIGS. 17A, 17B, and 17C, the underlying bulk silicon of the bulk layer 360 is etched to recess the silicon between the STIs 410. Etching may be by RIE or any other suitable etching technique.

Figure 18A:
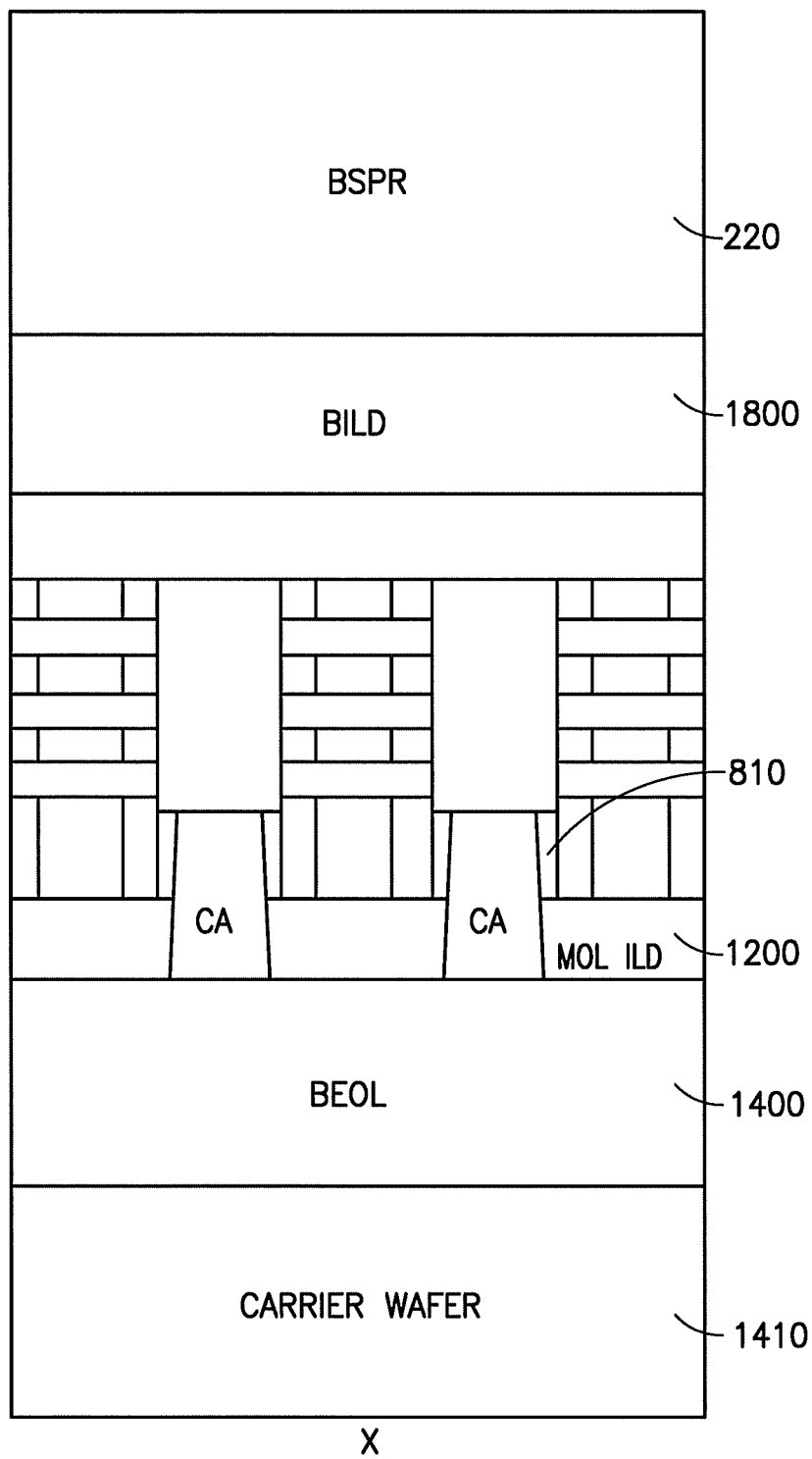
FIG. 18A is a schematic front view of the structure showing a backside interlayer dielectric deposition and backside power rail formation.
Figure 18B:
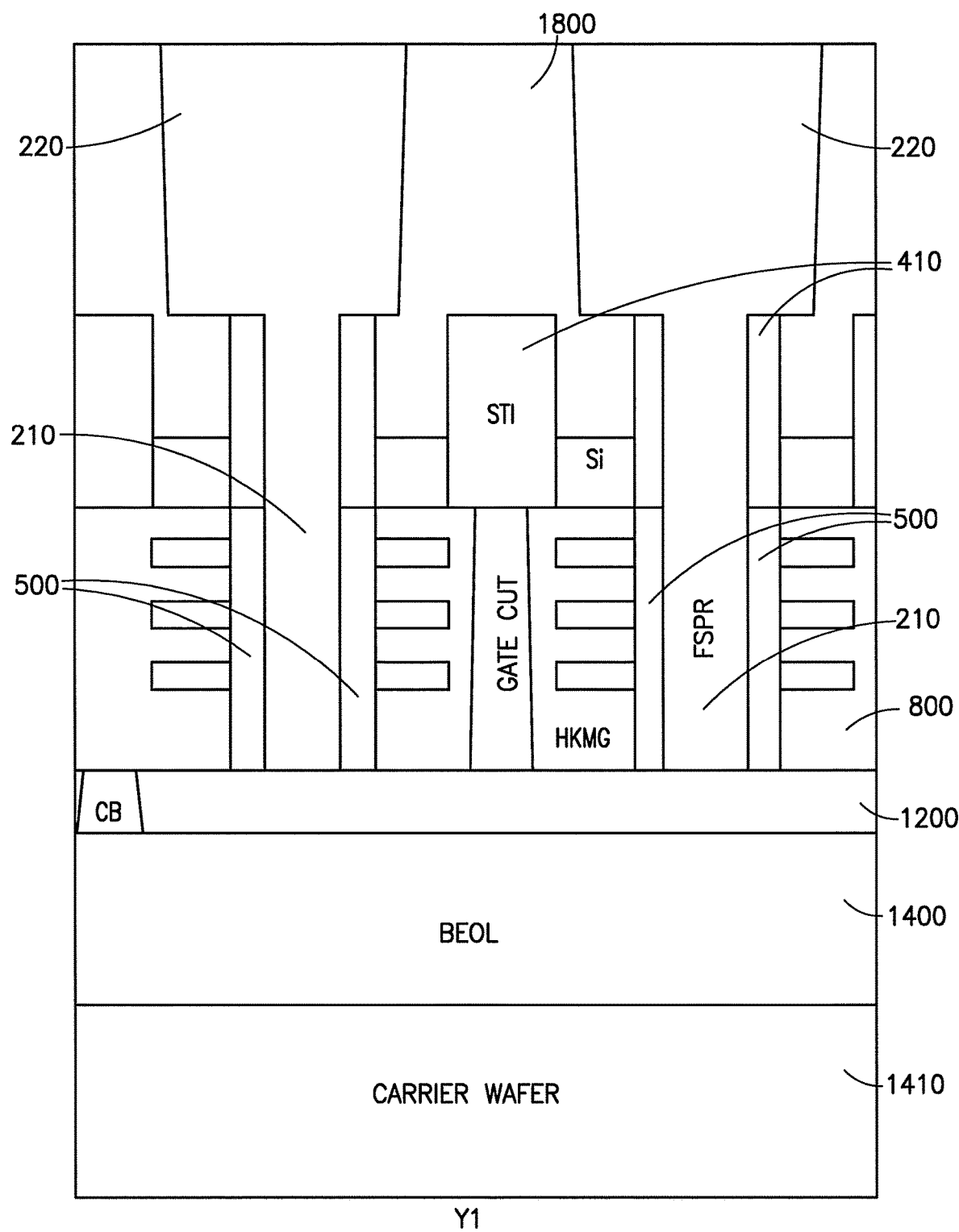
FIGS. 18B and 18C are schematic side views of the structure of FIG. 18A.
Figure 18C:
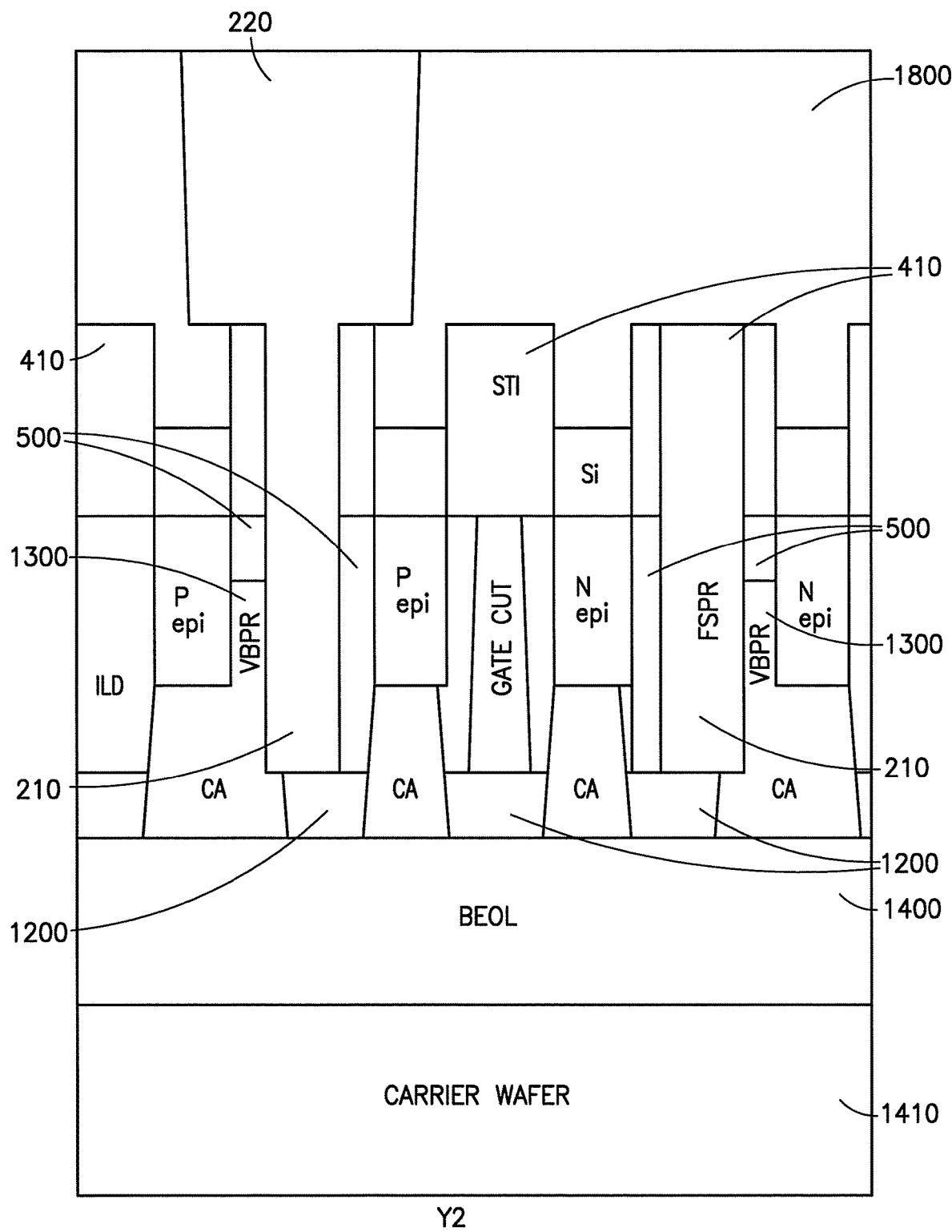

As shown in FIGS. 18A, 18B, and 18C, a backside interlayer dielectric 1800 (BILD 1800) is deposited into the spaces left by the recessed silicon so as to form a layer over the STIs 410. Etching is carried out to form openings down to the FSPRs 210, the openings subsequently being filled with metal to form the BSPRs 220. Planarization (such as CMP) may be carried out as necessary.

Figure 19A:
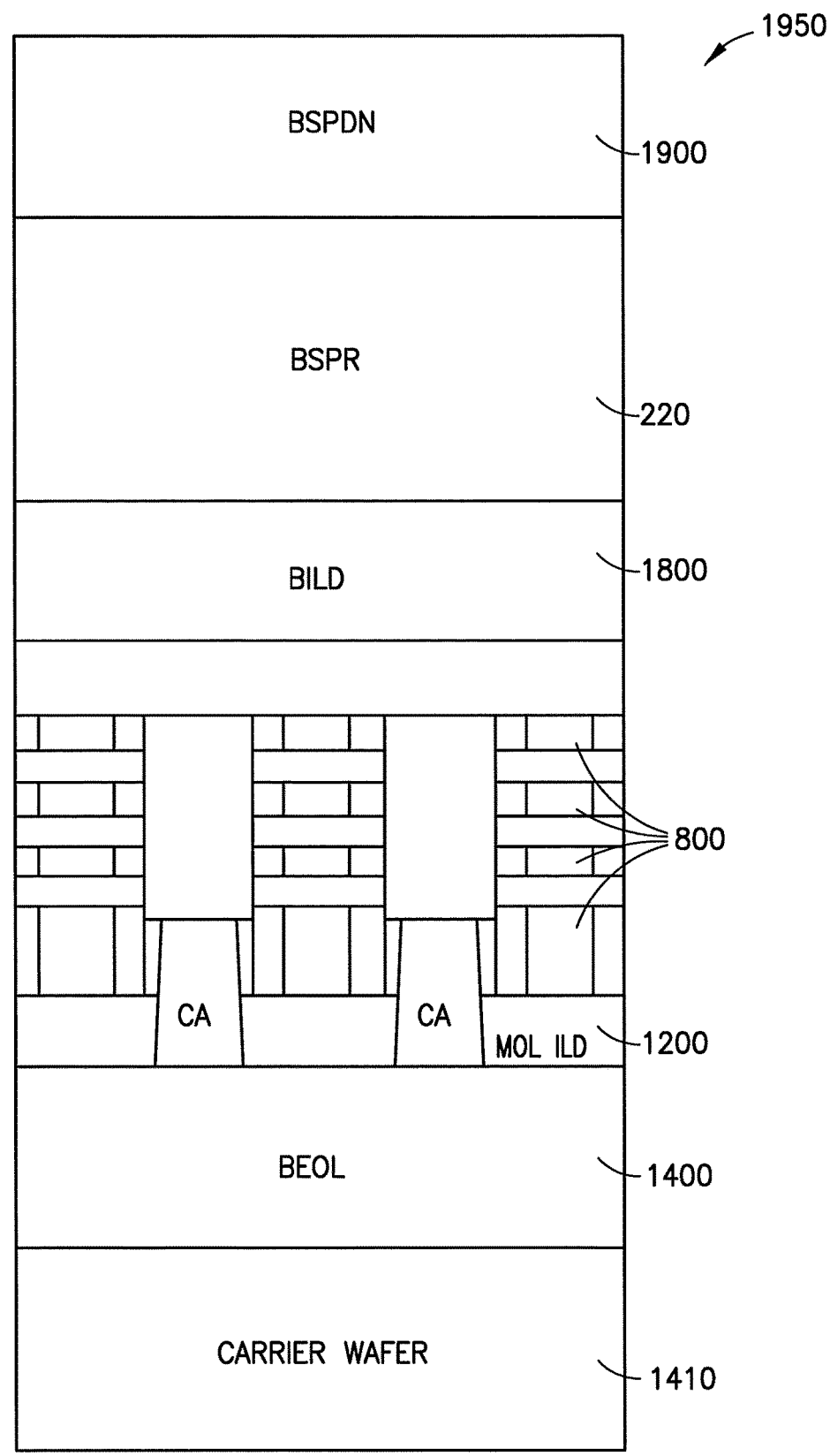
FIG. 19A is a schematic front view of the structure showing a backside power distribution network formation.
Figure 19B:
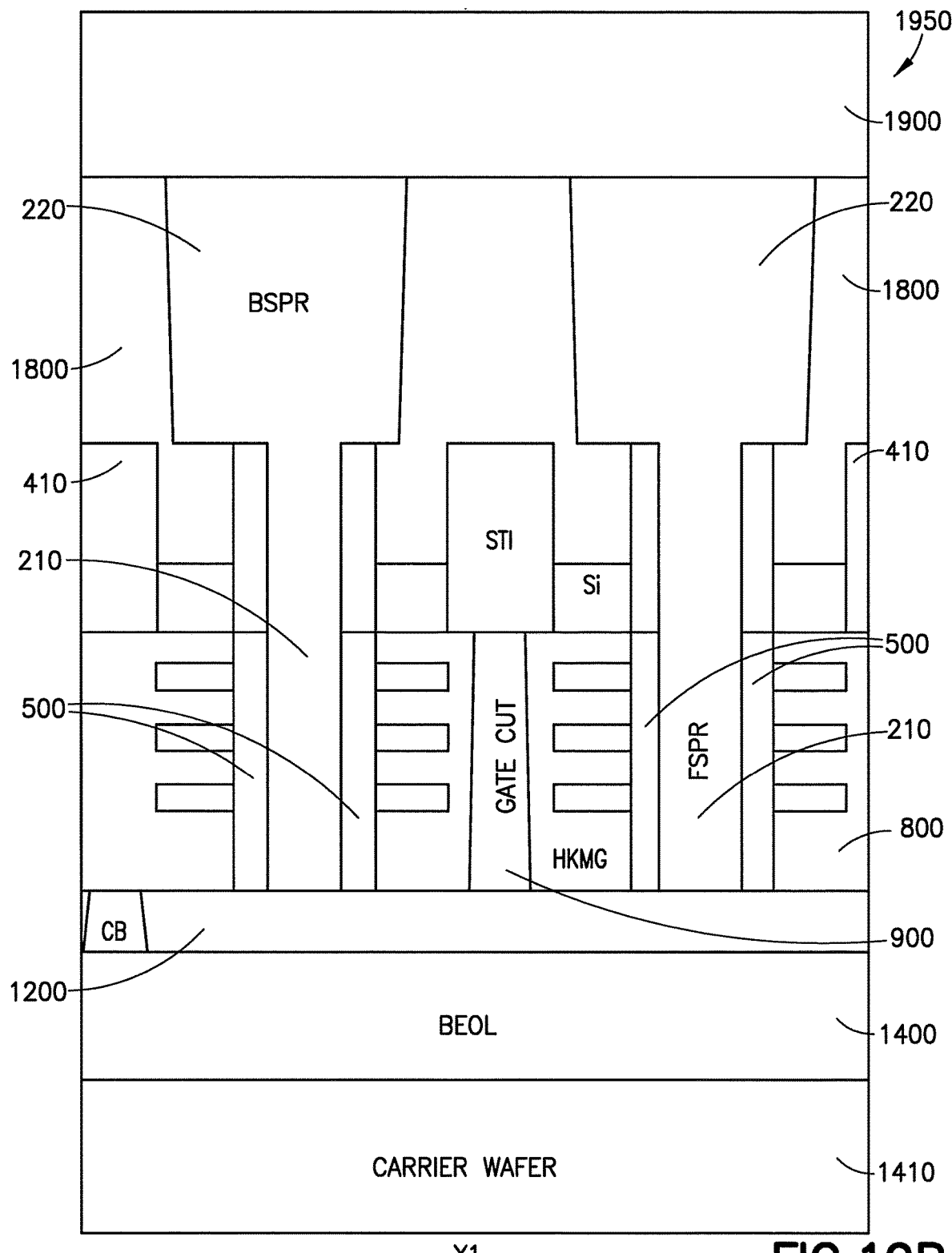
FIGS. 19B and 19C are schematic side views of the structure of FIG. 19A.
Figure 19C:
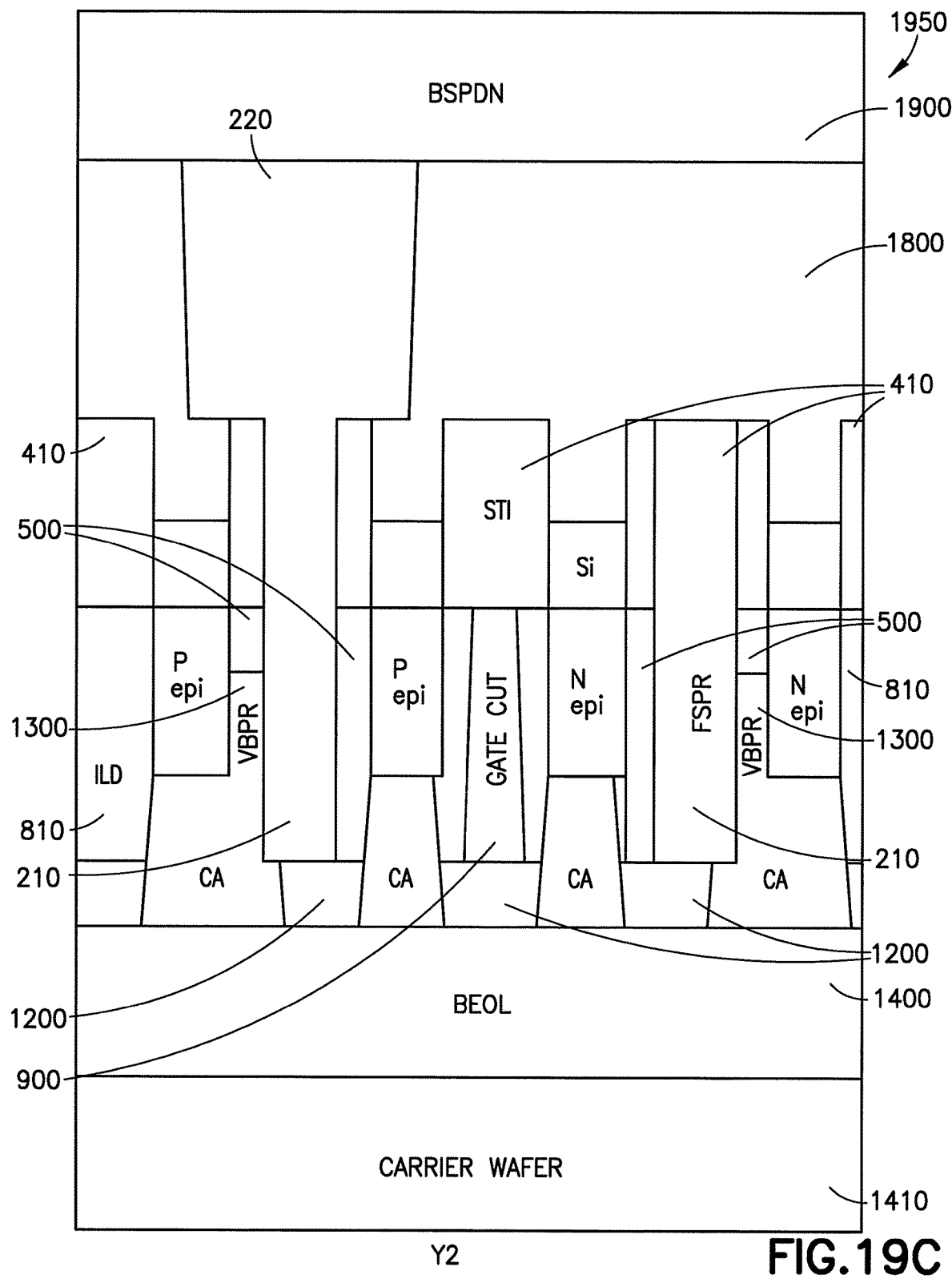

As shown in FIGS. 19A, 19B, and 19C, a BSPDN 1900 is disposed on the BSPRs 220 and the BILD 1800 to form the final structure 1950.

Figure 20:
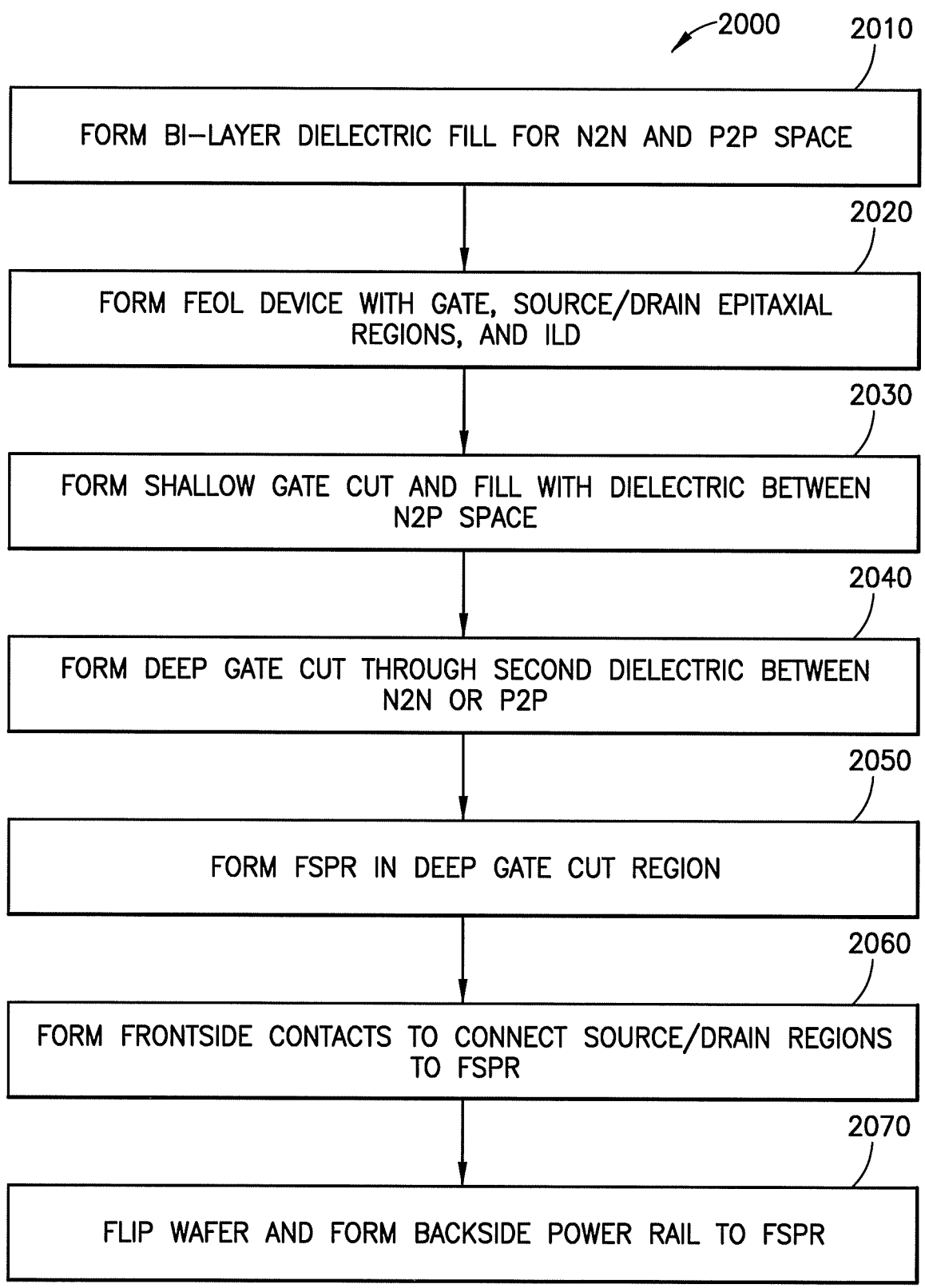
FIG. 20 is a flow of one exemplary embodiment of a process of fabricating the semiconductor device shown herein.

Referring to FIG. 20, one exemplary embodiment of a process flow for forming the device is shown generally at 2000 and is hereinafter referred to as "method 2000." In an initial step of the method 2000 to fabricate the structure, a bi-layer dielectric fill is carried out, as indicated in block 2010. Forming the dielectric fill may involve providing the silicon substrate with the etch stop layer and the bulk silicon, depositing the hardmask layer 400, patterning and forming the STIs 410, depositing the first dielectric 500 and the second dielectric 510, depositing the OPL 600, and etching. This bi-layer dielectric fill forms the channel regions in the P2P and N2N space. In block 2020, the FEOL device may be formed with the gate, source/drain regions may be epitaxially deposited, and the ILD 810 may be deposited. As shown in block 2030, shallow gate cuts are formed and filled with dielectric between N2P spaces. In block 2040, deep gate cuts are formed through the second dielectric 510 and through the STI 410 between the N2N or P2P spaces. As shown in block 2050, the FSPR 210 is formed in the deep cut region. As shown in block 2060, front side contacts are formed to connect source/drain regions to the FSPR 210. As shown in block 2070, the structure is flipped, and a backside power rail (e.g., BSPDN 1900) is formed to the FSPR 210.

Based on the above, a structure that is easily detectable may be fabricated. Such a structure can be widely used in the semiconductor industry.

In one aspect, a semiconductor device comprises: a channel comprising layers of silicon separated from each other; a metal gate in contact with the layers of silicon; source/drain regions adjacent to the metal gate; a frontside power rail extending through the layers of silicon; a dielectric separating the frontside power rail from the metal gate; a via-connect buried power rail extending through the dielectric and coupling the frontside power rail to the source/drain regions; and a backside power rail coupled to the frontside power rail. The layers of silicon are wrapped on three sides by the metal gate.

The semiconductor device may further comprise a middle-of-line interlayer dielectric disposed over a frontside of the channel, the metal gate, and the source/drain regions. The semiconductor device may further comprise a first contact extending through the middle-of-line interlayer dielectric to the via-connect buried power rail. The semiconductor device may further comprise a second contact extending through the middle-of-line interlayer dielectric to the metal gate. The semiconductor device may further comprise an isolation layer disposed over a backside of the channel, the metal gate, and the source/drain regions. The semiconductor device may further comprise a backside interlayer dielectric disposed on the isolation layer. The semiconductor device may further comprise a backside power distribution network disposed on the backside interlayer dielectric and the backside power rail.

In another aspect, a method comprises: providing a substrate; forming a dielectric fill on a top surface of the substrate to form a first channel region and a second channel region on the top surface of the substrate; forming a front-end-of-line device in each of the first channel region and the second channel region, each front-end-of-line device having a gate, source/drain regions, a second dielectric layer in the device comprising a second dielectric material, and a first dielectric layer comprising a first dielectric material surrounding the second dielectric layer; forming a shallow gate cut between the front-end-of-line device in the first channel region and the front-end-of-line device in the second channel region and filling the shallow gate cut with a third dielectric material; forming a first deep gate cut in the front-end-of-line device in the first channel region; forming a second deep gate cut in the front-end-of-line device in the second channel region; forming a first frontside power rail in the first deep gate cut; forming a second frontside power rail in the second deep gate cut; forming two or more frontside contacts to connect each of the first frontside power rail and the second frontside power rail to respective source/drain regions; forming a first backside power rail to the first frontside power rail; and forming a second backside power rail to the second frontside power rail. The front-end-of-line device in each of the first channel region and the second channel region is wrapped on three sides by the respective gate.

Forming the first deep gate cut in the front-end-of-line device in the first channel region and forming the second deep gate cut in the front-end-of-line device in the second channel region may comprise selectively etching to remove the second dielectric material and to leave the first dielectric material. Forming two or more frontside contacts to connect each of the first frontside power rail and the second frontside power rail to respective source/drain regions may comprise forming a first via-connect buried power rail in the first dielectric layer of each front-end-of-line device to connect each of the first frontside power rail and the second frontside power rail to respective source/drain regions. The method may further comprise flipping the substrate over and forming a backside power distribution network to the first backside power rail and the second backside power rail on a bottom surface of the substrate.

In another aspect, a method of forming a hybrid power rail formation in dielectric isolation for a semiconductor device comprises: providing a silicon substrate; forming a device on the substrate, the device having a channel, a replacement high-k metal gate around a portion of the channel, and source/drain regions adjacent to the replacement high-k metal gate; depositing an interlayer dielectric on the device; forming a deep gate cut in the device; forming a frontside power rail in the deep gate cut, the frontside power rail being isolated from the channel, the first replacement high-k metal gate, and the source/drain regions adjacent to the replacement high-k metal gate; forming a via-connect buried power rail to connect the source/drain regions adjacent to the replacement high-k metal gate to the frontside power rail; depositing a middle-of-the-line interlayer dielectric over the via-connect buried power rail; forming one or more contacts to the via-connect buried power rail; forming a back-end-of-line layer to the one or more contacts; and forming a backside power rail to the frontside power rail from a surface opposite to the back-end-of-line layer. Forming the device comprises configuring the device such that the channel is wrapped on three sides by the gate.

Forming the device may comprise depositing a first dielectric on the channel and a second dielectric on the first dielectric. Forming the via-connect buried power rail to connect the source/drain regions adjacent to the replacement high-k metal gate to the frontside power rail may comprise recessing the first dielectric and depositing a metal. The frontside power rail may be isolated from the channel using a dielectric material. One side of the channel may directly contact the dielectric material. The method may further comprise forming a carrier wafer on the back-end-of-line layer. The channel may comprise layers of silicon. Forming the replacement high-k metal gate and the source/drain regions may comprise epitaxial deposition of metal.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A semiconductor device, comprising:
a channel comprising layers of silicon separated from each other;
a metal gate in contact with the layers of silicon;
source/drain regions adjacent to the metal gate;
a frontside power rail extending through the layers of silicon;
a dielectric separating the frontside power rail from the metal gate;
a via-connect buried power rail extending through the dielectric and coupling the frontside power rail to the source/drain regions; and
a backside power rail coupled to the frontside power rail;
wherein the layers of silicon are wrapped on three sides by the metal gate.

2. The semiconductor device of claim 1, further comprising a middle-of-line interlayer dielectric disposed over a frontside of the channel, the metal gate, and the source/drain regions.

3. The semiconductor device of claim 2, further comprising a first contact extending through the middle-of-line interlayer dielectric to the via-connect buried power rail.

4. The semiconductor device of claim 2, further comprising a second contact extending through the middle-of-line interlayer dielectric to the metal gate.

5. The semiconductor device of claim 1, further comprising an isolation layer disposed over a backside of the channel, the metal gate, and the source/drain regions.

6. The semiconductor device of claim 5, further comprising a backside interlayer dielectric disposed on the isolation layer.

7. The semiconductor device of claim 6, further comprising a backside power distribution network disposed on the backside interlayer dielectric and the backside power rail.

8. A method, comprising:
providing a substrate;
forming a dielectric fill on a top surface of the substrate to form a first channel region and a second channel region on the top surface of the substrate;
forming a front-end-of-line device in each of the first channel region and the second channel region, each front-end-of-line device having a gate, source/drain regions, a second dielectric layer in the device comprising a second dielectric material, and a first dielectric layer comprising a first dielectric material surrounding the second dielectric layer;
forming a shallow gate cut between the front-end-of-line device in the first channel region and the front-end-of-line device in the second channel region and filling the shallow gate cut with a third dielectric material;
forming a first deep gate cut in the front-end-of-line device in the first channel region;
forming a second deep gate cut in the front-end-of-line device in the second channel region;
forming a first frontside power rail in the first deep gate cut;
forming a second frontside power rail in the second deep gate cut;
forming two or more frontside contacts to connect each of the first frontside power rail and the second frontside power rail to respective source/drain regions;
forming a first backside power rail to the first frontside power rail; and
forming a second backside power rail to the second frontside power rail;
wherein the front-end-of-line device in each of the first channel region and the second channel region is wrapped on three sides by the respective gate.

9. The method of claim 8, wherein forming the first deep gate cut in the front-end-of-line device in the first channel region and forming the second deep gate cut in the front-end-of-line device in the second channel region comprises selectively etching to remove the second dielectric material and to leave the first dielectric material.

10. The method of claim 8, wherein forming two or more frontside contacts to connect each of the first frontside power rail and the second frontside power rail to respective source/drain regions comprises forming a first via-connect buried power rail in the first dielectric layer of each front-end-of-line device to connect each of the first frontside power rail and the second frontside power rail to respective source/drain regions.

11. The method of claim 8, further comprising flipping the substrate over and forming a backside power distribution network to the first backside power rail and the second backside power rail on a bottom surface of the substrate.

12. A method of forming a hybrid power rail formation in dielectric isolation for a semiconductor device, the method comprising:
providing a silicon substrate;
forming a device on the substrate, the device having a channel, a replacement high-k metal gate around a portion of the channel, and source/drain regions adjacent to the replacement high-k metal gate;
depositing an interlayer dielectric on the device;
forming a deep gate cut in the device;
forming a frontside power rail in the deep gate cut, the frontside power rail being isolated from the channel, the first replacement high-k metal gate, and the source/drain regions adjacent to the replacement high-k metal gate;
forming a via-connect buried power rail to connect the source/drain regions adjacent to the replacement high-k metal gate to the frontside power rail;
depositing a middle-of-the-line interlayer dielectric over the via-connect buried power rail;
forming one or more contacts to the via-connect buried power rail;
forming a back-end-of-line layer to the one or more contacts; and
forming a backside power rail to the frontside power rail from a surface opposite to the back-end-of-line layer;
wherein forming the device comprises configuring the device such that the channel is wrapped on three sides by the gate.

13. The method of claim 12, wherein forming the device comprises depositing a first dielectric on the channel and a second dielectric on the first dielectric.

14. The method of claim 13, wherein forming the via-connect buried power rail to connect the source/drain regions adjacent to the replacement high-k metal gate to the frontside power rail comprises recessing the first dielectric and depositing a metal.

15. The method of claim 12, wherein the frontside power rail is isolated from the channel using a dielectric material.

16. The method of claim 15, wherein one side of the channel directly contacts the dielectric material.

17. The method of claim 12, further comprising forming a carrier wafer on the back-end-of-line layer.

18. The method of claim 12, wherein the channel comprises layers of silicon.

19. The method of claim 12, wherein forming the replacement high-k metal gate and the source/drain regions comprises epitaxial deposition of metal.

\* \* \* \* \*